US012787879B2

(12) United States Patent
Jung et al.

(10) Patent No.: US 12,787,879 B2
(45) Date of Patent: Nov. 3, 2026

(54) SEMICONDUCTOR CHIP AND SEMICONDUCTOR PACKAGE INCLUDING THE SAME

(71) Applicant: Samsung Electronics Co., Ltd., Suwon-si (KR)

(72) Inventors: Jihun Jung, Suwon-si (KR); Unbyoung Kang, Suwon-si (KR); Yeongkwon Ko, Suwon-si (KR); Seunghun Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 390 days.

(21) Appl. No.: 18/467,330

(22) Filed: Sep. 14, 2023

(65) Prior Publication Data

US 2024/0178191 A1 May 30, 2024

(30) Foreign Application Priority Data

Nov. 25, 2022 (KR) ........................ 10-2022-0160678

(51) Int. Cl.
*H10W 90/00* (2026.01)
*H10B 80/00* (2023.01)
*H10W 20/20* (2026.01)
*H10W 74/10* (2026.01)

(52) U.S. Cl.
CPC ............ *H10W 90/00* (2026.01); *H10B 80/00* (2023.02); *H10W 20/20* (2026.01); *H10W 74/141* (2026.01); *H10W 90/792* (2026.01)

(58) Field of Classification Search
CPC ... H10W 90/00; H10W 20/20; H10W 74/141; H10W 90/792; H10B 80/00;
(Continued)

(56) References Cited

U.S. PATENT DOCUMENTS 7,566,634 B2 7/2009 Beyne et al.
7,955,955 B2 6/2011 Lane et al.
(Continued)

FOREIGN PATENT DOCUMENTS

| | | | |
|---|---|---|---|
| JP | 6817372 B2 | | 1/2021 |
| JP | 7072993 B2 | | 5/2022 |
| KR | 100837269 B1 | | 6/2008 |
| KR | 20200047849 A | | 5/2020 |
| KR | 20210024869 A | | 3/2021 |

OTHER PUBLICATIONS

Korean Office Action for corresponding Korean Application No. 10-2022-0160678 dated Jul. 19, 2026.

*Primary Examiner* — Fernando L Toledo
*Assistant Examiner* — Shaw Shaw Muslim
(74) *Attorney, Agent, or Firm* — Harness, Dickey & Pierce, P.L.C.

(57) ABSTRACT

A semiconductor chip including a semiconductor substrate having an active surface and a non-active surface opposite to each other, a plurality of through electrodes passing through the semiconductor substrate, a plurality of wiring structures on the active surface and electrically connected to the plurality of through electrodes, an inter-wire insulating layer surrounding the plurality of wiring structures, a plurality of front chip connection pads electrically connected to the plurality of wiring structures, a front insulating layer surrounding the plurality of front chip connection pads, on the inter-wire insulating layer, a plurality of rear chip connection pads disposed on the non-active surface and electrically connected to the plurality of through electrodes, and a rear insulating layer surrounding the plurality of rear chip connection pads, on the non-active surface, wherein the front insulating layer includes a cover insulating portion covering a side surface of the inter-wire insulating layer may be provided.

20 Claims, 35 Drawing Sheets

(58) Field of Classification Search
CPC ............. H01L 21/561; H01L 21/76898; H01L 23/3128; H01L 23/481; H01L 24/05; H01L 24/08; H01L 24/13; H01L 24/81; H01L 25/18; H01L 2221/68327; H01L 24/16; H01L 2225/06517; H01L 25/50; H01L 2225/06513; H01L 2225/06541; H01L 23/3185; H01L 25/0657; H01L 23/3171; H01L 23/4824; H01L 23/5283; H01L 24/07; H01L 2224/08146; H01L 2225/06527
See application file for complete search history.

(56) References Cited

U.S. PATENT DOCUMENTS

| | | | | |
|---|---|---|---|---|
| 9,299,614 | B2 | 3/2016 | Holden et al. | |
| 9,496,193 | B1 * | 11/2016 | Roesner | H01L 21/78 |
| 10,410,923 | B2 | 9/2019 | Sandoh | |
| 10,665,557 | B2 | 5/2020 | Han et al. | |
| 10,790,264 | B2 * | 9/2020 | Hong | H01L 25/105 |
| 2007/0269931 | A1 | 11/2007 | Chung et al. | |
| 2021/0066251 | A1 * | 3/2021 | Kim | H10W 74/121 |
| 2022/0130799 | A1 * | 4/2022 | Jang | H01L 23/481 |
| 2023/0112006 | A1 * | 4/2023 | Oh | H01L 25/18<br>257/777 |
| 2023/0170258 | A1 * | 6/2023 | Huang | H01L 21/78<br>257/773 |

* cited by examiner

SEMICONDUCTOR CHIP AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2022-0160678, filed on Nov. 25, 2022, in the Korean Intellectual Property Office, the disclosure of which is incorporated by reference herein in its entirety.

BACKGROUND

The inventive concepts relate to semiconductor chips and semiconductor packages including the semiconductor chip, and more particularly, to semiconductor chips and/or semiconductor packages including stacked semiconductor chips.

As there is demand for electronic products to be miniaturized, to have high capacity, and to have high performance, there is a need for higher integration and higher speed semiconductor packages. To this end, semiconductor packages including stacked semiconductor chips and semiconductor chips to be stacked in a semiconductor package have been developed.

SUMMARY

The inventive concepts provide semiconductor chips to be stacked with electrical connection reliability in a semiconductor package, and/or semiconductor packages including the semiconductor chip.

Some example embodiments of the invention concepts provide the following semiconductor chips and semiconductor packages including such semiconductor chip.

According to an aspect of the inventive concepts, a semiconductor chip may include a semiconductor substrate having an active surface and a non-active surface opposite to each other, a plurality of through electrodes passing through the semiconductor substrate, a plurality of wiring structures on the active surface and electrically connected to the plurality of through electrodes, an inter-wire insulating layer surrounding the plurality of wiring structures, a plurality of front chip connection pads electrically connected to the plurality of wiring structures, a front insulating layer surrounding the plurality of front chip connection pads on the inter-wire insulating layer, a plurality of rear chip connection pads disposed on the non-active surface and electrically connected to the plurality of through electrodes, and a rear insulating layer surrounding the plurality of rear chip connection pads on the non-active surface, wherein the front insulating layer includes a cover insulating portion covering a side surface of the inter-wire insulating layer and extending into the semiconductor substrate through the active surface.

According to an aspect of the inventive concepts, a semiconductor package may include a first semiconductor chip including a first semiconductor substrate having a first active surface and a first non-active surface opposite to each other, a plurality of first through electrodes passing through the first semiconductor substrate, a first front insulating layer on the first active surface, and a first rear insulating layer on the first non-active surface, a second semiconductor chip including a second semiconductor substrate having a second active surface and a second non-active surface opposite to each other, and a second front insulating layer on the second active surface, the second active surface facing the first non-active surface and the second semiconductor chip being stacked on the first semiconductor chip, and a plurality of first bonding pads between the first semiconductor chip and the second semiconductor chip, surrounded by the first rear insulating layer and the second front insulating layer, and electrically connected to the plurality of first through electrodes, wherein the second front insulating layer includes a cover insulating portion extending into the second semiconductor substrate through the second active surface and covering a side surface of the second semiconductor chip.

According to an aspect of the inventive concepts, a semiconductor package may include a high bandwidth memory (HBM) control die including a first semiconductor substrate having a first active surface and a first non-active surface opposite to each other, a plurality of first through electrodes passing through the first semiconductor substrate, a first front insulating layer on the first active surface, and a first rear insulating layer on the first non-active surface, a plurality of dynamic random access memory (DRAM) die including a second semiconductor substrate having a second active surface and a second non-active surface opposite to each other, a plurality of second through electrodes passing through the second semiconductor substrate, a second front insulating layer on the second active surface, and a second rear insulating layer on the second non-active surface, the second active surface facing the first non-active surface and the plurality of DRAM dies being sequentially stacked on the HBM control die and having horizontal widths less than a horizontal width of the HBM control die, a plurality of first bonding pads between a lowermost DRAM die of the plurality of DRAM dies and the HBM control die and surrounded by the second front insulating layer of the lowermost DRAM die of the plurality of DRAM dies and the first rear insulating layer, and a plurality of second bonding pads between two adjacent DRAM dies among the plurality of DRAM dies and surrounded by the second front insulating layer and the second rear insulating layer between the two adjacent DRAM dies among the plurality of DRAM dies, wherein the second front insulating layer includes a cover insulating portion extending into the second semiconductor substrate through the second active surface and covering a side surface of each of the DRAM dies, and only the cover insulating portion, the second semiconductor substrate, and the second rear insulating layer are exposed on the side surface each of the DRAM dies.

BRIEF DESCRIPTION OF THE DRAWINGS

Example embodiments will be more clearly understood from the following detailed description taken in conjunction with the accompanying drawings in which.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., +10%).

When the terms "about" or "substantially" are used in this specification in connection with a numerical value, it is intended that the associated numerical value includes a manufacturing or operational tolerance (e.g., +10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

Figure 1:
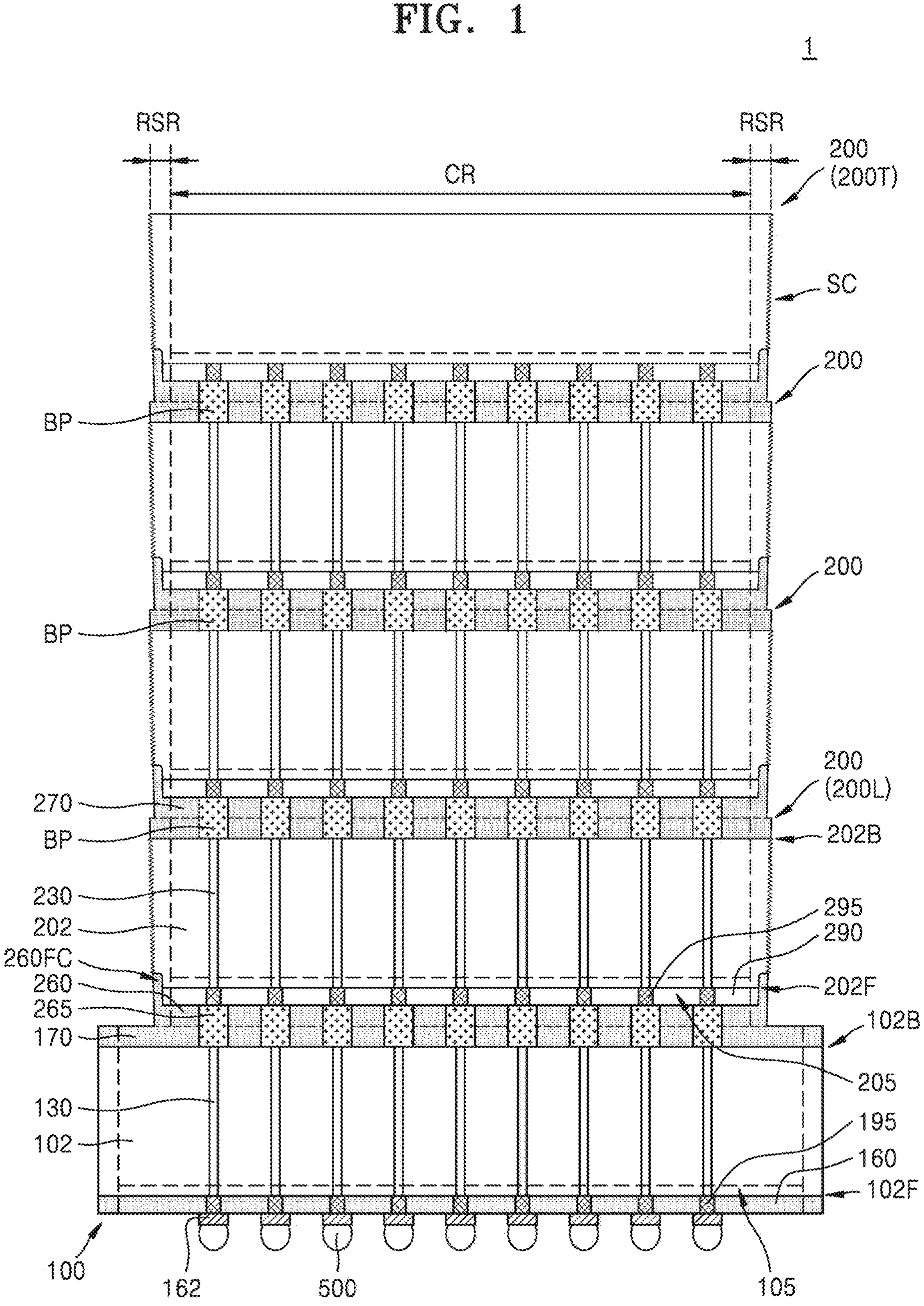
FIG. 1 is a cross-sectional view of a semiconductor package according to an example embodiment.

FIG. 1 is a cross-sectional view of a semiconductor package 1 according to an example embodiment.

Referring to FIG. 1, the semiconductor package 1 includes a first semiconductor chip 100 and a plurality of second semiconductor chips 200. Although it is illustrated in FIG. 1 that the semiconductor package 1 includes four second semiconductor chips 200, the inventive concepts are not limited thereto. For example, the semiconductor package 1 may include two or more second semiconductor chips 200. In some example embodiments, the semiconductor package 1 may include a multiple of four second semiconductor chips 200. The plurality of second semiconductor chips 200 may be sequentially stacked on the first semiconductor chip 100. For convenience of description, a second semiconductor chip 200 positioned at the bottom from among the plurality of second semiconductor chips 200 may be referred to as a lowermost second semiconductor chip 200L, and a second semiconductor chip 200 positioned at the top from among the plurality of second semiconductor chips 200 may be referred to as an uppermost second semiconductor chip 200T.

In the semiconductor package 1, the first semiconductor chip 100 and the plurality of second semiconductor chips 200 may be electrically connected to each other through a plurality of bonding pads BP to exchange signals and to provide a power voltage and a ground voltage. For example, the plurality of bonding pads BP may be arranged between the lowermost second semiconductor chip 200L and the first semiconductor chip 100, and between two second semiconductor chips 200 adjacent to each other from among the plurality of second semiconductor chips 200.

The first semiconductor chip 100 may include a first semiconductor substrate 102 having a first active surface 102F and a first non-active surface 102B opposite to each other, a first semiconductor device 105 disposed on the first active surface 102F of the first semiconductor substrate 102, and a plurality of first through electrodes 130 passing through at least a portion of the first semiconductor substrate 102.

A plurality of first wiring structures 195 electrically connected to the plurality of first through electrodes 130 and a first front insulating layer 160 surrounding the plurality of first wiring structures 195 may be disposed on the first active surface 102F of the first semiconductor substrate 102. A first rear insulating layer 170 may be disposed on the first non-active surface 102B of the first semiconductor substrate 102. The first rear insulating layer 170 may surround portions of bonding pads BP, which are disposed between the lowermost second semiconductor chip 200L and the first semiconductor chip 100, from among the plurality of bonding pads BP. For example, the first rear insulating layer 170 may surround lower portions of the bonding pads BP, which are disposed between the lowermost second semiconductor chip 200L and the first semiconductor chip 100, from among the plurality of bonding pads BP.

In some example embodiments, the first semiconductor chip 100 may further include a plurality of first front chip connection pads 162 electrically connected to the plurality of first wiring structures 195. The plurality of first front chip connection pads 162 may be electrically connected to the first semiconductor device 105 and/or the plurality of first through electrodes 130 through the plurality of first wiring structures 195. A plurality of package connection terminals 500 may be attached to the plurality of first front chip connection pads 162. For example, the package connection terminals 500 may be solder balls or bumps.

The second semiconductor chip 200 may include a second semiconductor substrate 202 having a second active surface 202F and a second non-active surface 202B opposite to each other, a second semiconductor device 205 disposed on the second surface 202F of the second semiconductor substrate 202, and a plurality of second through electrodes 230 passing through at least a portion of the second semiconductor substrate 202. In some example embodiments, the uppermost second semiconductor chip 200T may not include the plurality of second through electrodes 230. In some example embodiments, the vertical height of the uppermost second semiconductor chip 200T among the plurality of second semiconductor chips 200 may be greater than the vertical height of each of the remaining second semiconductor chips 200. In some example embodiments, the vertical heights of the remaining second semiconductor chips 200 other than the uppermost second semiconductor chip 200T among the plurality of second semiconductor chips 200 may have substantially the same value.

A plurality of second wiring structures 295 electrically connected to the plurality of second through electrodes 230 and an inter-wire insulating layer 290 surrounding the plurality of second wiring structures 295 may be disposed on the second active surface 202F of the second semiconductor substrate 202. The inter-wire insulating layer 290 included in the second semiconductor chip 200 may be referred to as a second inter-wire insulating layer 290. A second front insulating layer 260 may be disposed on the inter-wire insulating layer 290. The second front insulating layer 260 may surround portions of a plurality of bonding pads BP. For example, the second front insulating layer 260 may surround upper portions of the plurality of bonding pads BP.

The second front insulating layer 260 may further include a cover insulating portion 260FC extending along a side surface of the second semiconductor chip 200. The cover insulating portion 260FC may pass through the second active surface 202F of the second semiconductor substrate 202 and extend into the second semiconductor substrate 202. The cover insulating portion 260FC may be referred to as a second cover insulating portion 260FC.

A second rear insulating layer 270 may be disposed on the second non-active surface 202B of the second semiconductor substrate 202. The second rear insulating layer 270 may surround portions of the plurality of bonding pads BP. For example, the second rear insulating layer 270 may surround lower portions of bonding pads BP disposed between two adjacent second semiconductor chips 200, from among a plurality of bonding pads BP.

The plurality of bonding pads BP may be electrically connected to the plurality of first through electrodes 130 and the plurality of second through electrodes 230. For example, the plurality of bonding pads BP may include Cu. Among the plurality of bonding pads BP, bonding pads BP disposed between the lowermost second semiconductor chip 200L and the first semiconductor chip 100 may be referred to as a plurality of first bonding pads, and bonding pads BP disposed between two adjacent second semiconductor chips 200, from among the plurality of second semiconductor chips 200 may be referred to as a plurality of second bonding pads.

The plurality of first bonding pads may be disposed between the second wiring structure 295 of the lowermost second semiconductor chip 200L and the first through electrode 130 of the first semiconductor chip 100 and electrically connect the second wiring structure 295 to the first through electrode 130. The plurality of second bonding pads may be disposed between a second wiring structure 295 of an upper second semiconductor chip 200 of two adjacent second semiconductor chips 200 and a second through electrode 230 of a lower second semiconductor chip 200 of the two adjacent second semiconductor chips 200 and electrically connect the second wiring structure 295 to the second through electrode 230.

The plurality of first bonding pads may be surrounded by the first rear insulating layer 170 and the second front insulating layer 260, and the plurality of second bonding pads may be surrounded by the second rear insulating layer 270 and the second front insulating layer 260. The plurality of first bonding pads may pass through the first rear insulating layer 170 and the second front insulating layer 260, and the plurality of second bonding pads may pass through the second rear insulating layer 270 and the second front insulating layer 260. Each of the first rear insulating layer 170, the second front insulating layer 260, and the second rear insulating layer 270 may include one of SiO, SiN, SiCN, SiCO, and a polymer material. The polymer material may be benzocyclobutene (BCB), polyimide (PI), polybenzoxazole (PBO), silicone, acrylate, or epoxy. For example, each of the first rear insulating layer 170, the second front insulating layer 260, and the second rear insulating layer 270 may include silicon oxide. In some example embodiments, each of the first rear insulating layer 170, the second front insulating layer 260, and the second rear insulating layer 270 may include the same material.

On the side surface of each of the plurality of second semiconductor chips 200, only the cover insulating portion 260FC may be disposed between the lower surface of the second semiconductor chip 200 (e.g., the front surface of the second semiconductor chip 200) and the second semiconductor substrate 202. The cover insulating portion 260FC is a portion of the second front insulating layer 260 and may include a single material. In other words, on the side surface of each of the plurality of second semiconductor chips 200, only an insulating layer including a single material may be disposed between the lower surface of the second semiconductor chip 200 (e.g., the front surface of the second semiconductor chip 200) and the second semiconductor substrate 202.

Of the side surface of the second semiconductor chip 200, the side surface of the second front insulating layer 260 (e.g., the side surface of the cover insulating portion 260FC) may have a substantially flat surface and the side surface of the second rear insulating layer 270 may have a substantially flat surface. Of the side surface of the second semiconductor chip 200, the side surface of the second semiconductor substrate 202 may be a rough surface having a scallop SC. In some example embodiments, the side surface of the first semiconductor chip 100 may be a substantially flat surface without scallops.

Each of the plurality of bonding pads BP may be formed by forming conductive material layers on surfaces, which face each other, of two adjacent chips among the first semiconductor chip 100 and the plurality of second semiconductor chips 200 and then by diffusion-bonding the conductive material layers facing each other so that the conductive material layers facing each other expand by heat to contact each other and form a single body through diffusion of metal atoms included therein. The first rear insulating layer 170 and the second front insulating layer 260, which surround the plurality of first bonding pads, may be bonded (or coupled) to each other by forming a covalent bond, and the second rear insulating layer 270 and the second front insulating layer 260, which surround the plurality of second bonding pads, may be bonded (or coupled) to each other by forming a covalent bond. In other words, the first semiconductor chip 100 and the plurality of second semiconductor chips 200 are stacked by hybrid bonding.

Figure 2A:
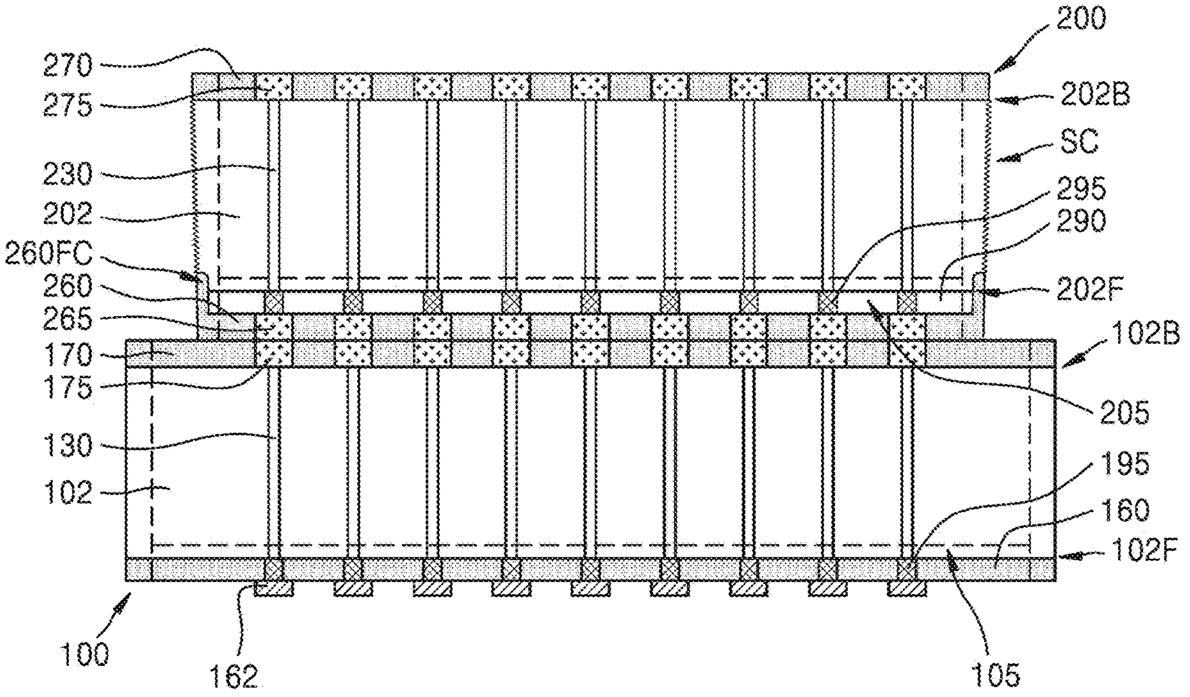
FIGS. 2A to 2E are cross-sectional views illustrating a method of manufacturing a semiconductor package, according to an example embodiment.

For example, the plurality of first bonding pads may be formed by forming a plurality of first rear chip connection pads 175 and a plurality of second front chip connection pads 265 shown in FIG. 2A and then by diffusion-bonding each of the first rear chip connection pads 175 with a corresponding one of the second front chip connection pads 265 so that the first rear chip connection pad 175 and the second front chip connection pad 265 facing each other expand by heat to contact each other and form a single body through diffusion of metal atoms included therein. For example, the plurality of second bonding pads may be formed by forming a plurality of second rear chip connection pads 275 and a plurality of second front chip connection pads 265 shown in FIG. 2C and then by diffusion-bonding each of the second rear chip connection pads 275 with a corresponding one of the second front chip connection pads 265 so that the second rear chip connection pad 275 and the second front chip connection pad 265 facing each other expand by heat to contact each other and form a single body through diffusion of metal atoms included therein.

In the semiconductor package 1, the first semiconductor chip 100 may be disposed such that the first active surface 102F of the first semiconductor substrate 102 faces downward and the first non-active surface 102B faces upward, and the second semiconductor chip 200 may be disposed such that the second active surface 202F of the second semiconductor substrate 202 faces downward and the second non-active surface 202B faces upward. The plurality of second semiconductor chips 200 may be sequentially stacked on the first semiconductor chip 100 such that the second active surface 202F faces the first non-active surface 102B of the first semiconductor chip 100.

Unless otherwise stated in the present specification, the upper surface of the first semiconductor chip 100 of the semiconductor package 1 refers to a side facing the first non-active surface 102B of the first semiconductor substrate 102, the lower surface of the first semiconductor chip 100 refers to a side facing the first active surface 102F of the first semiconductor substrate 102, the upper surface of the second semiconductor chip 200 refers to a side facing the second non-active surface 202B of the second semiconductor substrate 202, and the lower surface of the second semiconductor chip 200 refers to a side facing the second active surface 202F of the second semiconductor substrate 202. The lower surface of the first semiconductor chip 100 facing the first active surface 102F of the first semiconductor substrate 102 may be referred to as a front surface of the first semiconductor chip 100, and the upper surface of the first semiconductor chip 100 facing the first non-active surface 102B may be referred to as a rear surface of the first semiconductor chip 100. The lower surface of the second semiconductor chip 200 facing the second active surface 202F of the second semiconductor substrate 202 may be referred to as a front surface of the second semiconductor chip 200, and the upper surface of the second semiconductor chip 200 facing the second non-active surface 202B may be referred to as a rear surface of the second semiconductor chip 200.

The horizontal width and horizontal area of the first semiconductor chip 100 may have values greater than those of each of the plurality of second semiconductor chips 200. The upper surface and the lower surface of the first semiconductor chip 100, that is, the rear surface and the front surface thereof may have substantially the same horizontal width and horizontal area. For example, a vertical cross-section of the first semiconductor chip 100 may have a rectangular shape. The upper surface and the lower surface of the second semiconductor chip 200, that is, the rear surface and the front surface thereof may have different horizontal widths and different horizontal areas. In some example embodiments, the upper surface of the second semiconductor chip 200 may have a larger horizontal width and larger horizontal area than the lower surface of the second semiconductor chip 200. For example, a vertical cross-section of the second semiconductor chip 200 may have a trapezoidal shape, and an upper side of a pair of parallel sides of the trapezoidal shape may be greater than a lower side of the pair of parallel opposite sides.

Each of the first semiconductor chip 100 and the second semiconductor chip 200 may include a chip region CR and a residual scribe lane region RSR surrounding the chip region CR. The residual scribe lane region RSR may be a portion remaining along the edge of the chip region CR without being removed among scribe lane regions SR shown in FIGS. 3A to 3K or 4A to 4K. The cover insulating portion 260FC may be arranged in the residual scribe lane region RSR of the second semiconductor chip 200.

The first semiconductor substrate 102 and the second semiconductor substrate 202 may include, for example, a semiconductor material, such as silicon (Si). In some example embodiments, the first semiconductor substrate 102 and the second semiconductor substrate 202 may include a semiconductor material, such as germanium (Ge). The first semiconductor substrate 102 and the second semiconductor substrate 202 may include a conductive region, for example, a well doped with impurities. The first semiconductor substrate 102 and the second semiconductor substrate 202 may have various device isolation structures, such as a shallow trench isolation (STI) structure.

Each of the first semiconductor device 105 and the second semiconductor device 205 may include a plurality of individual devices of various types. The plurality of individual devices may include various microelectronic devices, for example, a metal-oxide-semiconductor field effect transistor (MOSFET) such as a complementary metal-oxide-semiconductor transistor (CMOS transistor), system large scale integration (LSI), an image sensor such as a CMOS imaging sensor (CIS), a micro-electro-mechanical system (MEMS), an active device, and/or a passive device. The plurality of individual devices may be electrically connected to the conductive region of the first semiconductor substrate 102 or the second semiconductor substrate 202. Each of the first semiconductor device 105 and the second semiconductor device 205 may further include a conductive line or conductive plug electrically connecting at least two of the plurality of individual devices or the plurality of individual devices to the conductive region of a corresponding one of the first semiconductor substrate 102 and the second semiconductor substrate 202. In addition, each of the plurality of individual devices may be electrically separated from other neighboring individual devices by an insulating layer.

At least one of the first semiconductor chip 100 and the second semiconductor chip 200 may be a memory semiconductor chip. In some example embodiments, the first semiconductor chip 100 may include a serial-parallel conversion circuit and may be a buffer chip for controlling the plurality of second semiconductor chips 200, and the plurality of second semiconductor chips 200 may be memory chips including memory cells. For example, the semiconductor package 1 including the first semiconductor chip 100 and the plurality of second semiconductor chips 200 may be a high bandwidth memory (HBM), and the first semiconductor chip 100 may be referred to as a HBM controller die and each of the plurality of second semiconductor chips 200 may be referred to as a dynamic random access memory (DRAM) die.

Each of the first through electrode 130 and the second through electrode 230 may include a through silicon via (TSV). Each of the first through electrode 130 and the second through electrode 230 may include a conductive plug passing through a corresponding one of the first semiconductor substrate 102 and the second semiconductor substrate 202 and a conductive barrier layer surrounding the conductive plug. The conductive plug may have a cylindrical shape, and the conductive barrier layer may have a cylindrical shape surrounding a sidewall of the conductive plug. A via insulating layer may be disposed between the first through electrode 130 and the first semiconductor substrate 102 and between the second through electrode 230 and the second semiconductor substrate 202, thereby surrounding sidewalls of the first through electrode 130 and the second through electrode 230. The first through electrode 130 and the second through electrode 230 may be formed in one of a via-first structure, a via-middle structure, and a via-last structure.

In some example embodiments, the semiconductor package 1 may further include, on the first semiconductor chip 100, a package molding layer surrounding an upper surface of the first semiconductor chip 100 and surrounding the plurality of second semiconductor chips 200. The package molding layer may include, for example, an epoxy mold compound (EMC). In some example embodiments, the package molding layer may cover an upper surface of the uppermost second semiconductor chip 200T. In some other example embodiments, the package molding layer may not cover the upper surface of the uppermost second semiconductor chip 200T. For example, a heat dissipation member may be attached to the uppermost second semiconductor chip 200T with a thermal interface material (TIM) therebetween.

The semiconductor package 1 according to an example embodiment of the inventive concepts may be formed by stacking the first semiconductor chip 100 and the plurality of second semiconductor chips 200 by using hybrid bonding. Only the second front insulating layer 260 may be disposed on the residual scribe lane region RSR of the lower surface (e.g., the front surface) of the second semiconductor chip 200, on which the hybrid bonding is performed. On the side surface of each of the plurality of second semiconductor chips 200, only the cover insulating portion 260FC, which is a portion of the second front insulating layer 260, may be disposed between the lower surface (e.g., the front surface) of the second semiconductor chip 200 and the second semiconductor substrate 202.

In other words, a test device group (TEG) and/or an alignment key are not present in the residual scribe lane region RSR of the second semiconductor chip 200, and only a portion of the second front insulating layer 260 including the cover insulating portion 260FC may be disposed between the lower surface (e.g., the front surface) of the second semiconductor chip 200 and the second semiconductor substrates 202. Thus, the occurrence of burrs in the plurality of second semiconductor chips 200 formed by singulation of sawing wafers may be reduced. Therefore, in the process of stacking the first semiconductor chip 100 and the plurality of second semiconductor chips 200 by using hybrid bonding, generation of voids due to lifting between the first semiconductor chip 100 and the plurality of second semiconductor chips 200 may be mitigated or prevented. Therefore, the structural reliability of the semiconductor package 1 may be improved, and the electrical connection reliability between the first semiconductor chip 100 and the plurality of second semiconductor chips 200 may be improved.

FIGS. 2A to 2E are cross-sectional views illustrating a method of manufacturing a semiconductor package, according to an example embodiment.

Referring to FIG. 2A, a first semiconductor chip 100 and a second semiconductor chip 200 are prepared.

The first semiconductor chip 100 may include a plurality of first rear chip connection pads 175 disposed on a first non-active surface 102B of a first semiconductor substrate 102, and a first rear insulating layer 170 surrounding the plurality of first rear chip connection pads 175 on the first non-active surface 102B. The plurality of first rear chip connection pads 175 may be connected to a plurality of first through electrodes 130. The plurality of first rear chip connection pads 175 may correspond to lower portions of bonding pads BP, which are disposed between the lowermost second semiconductor chip 200L and the first semiconductor chip 100, from among the plurality of bonding pads BP shown in FIG. 1.

The second semiconductor chip 200 may include a plurality of second front chip connection pads 265 disposed on a second active surface 202F of a second semiconductor substrate 202, a second front insulating layer 260 surrounding the plurality of second front chip connection pads 265 on the second active surface 202F, a plurality of second rear chip connection pads 275 disposed on a second non-active surface 202B of the second semiconductor substrate 202, and a second rear insulating layer 270 surrounding the plurality of second rear chip connection pads 275 on the second non-active surface 202B. The plurality of second front chip connection pads 265 may be connected to a plurality of second through electrodes 230. The plurality of second front chip connection pads 265 may correspond to upper portions of the bonding pads BP, which are disposed between the lowermost second semiconductor chip 200L and the first semiconductor chip 100, from among the plurality of bonding pads BP shown in FIG. 1. The plurality of second rear chip connection pads 275 may be connected to the plurality of second through electrodes 230. The plurality of second rear chip connection pads 275 may correspond to lower portions of bonding pads BP disposed between two adjacent second semiconductor chips 200, respectively, from among the plurality of bonding pads BP shown in FIG. 1.

The second semiconductor chip 200 is placed on the first semiconductor chip 100. The second semiconductor chip 200 may be placed on the first semiconductor chip 100 such that the plurality of first rear chip connection pads 175 of the first semiconductor chip 100 and the plurality of second front chip connection pads 265 of the second semiconductor chip 200 are in contact with each other. The second semiconductor chip 200 in FIG. 2A may be the second semiconductor chip 200 positioned at the bottom from among the plurality of second semiconductor chips 200, that is, the lowermost second semiconductor chip 200L shown in FIG. 1. The second semiconductor chip 200 may be positioned on the first semiconductor chip 100 such that the second front insulating layer 260 faces the first rear insulating layer 170 of the first semiconductor chip 100.

Figure 2B:
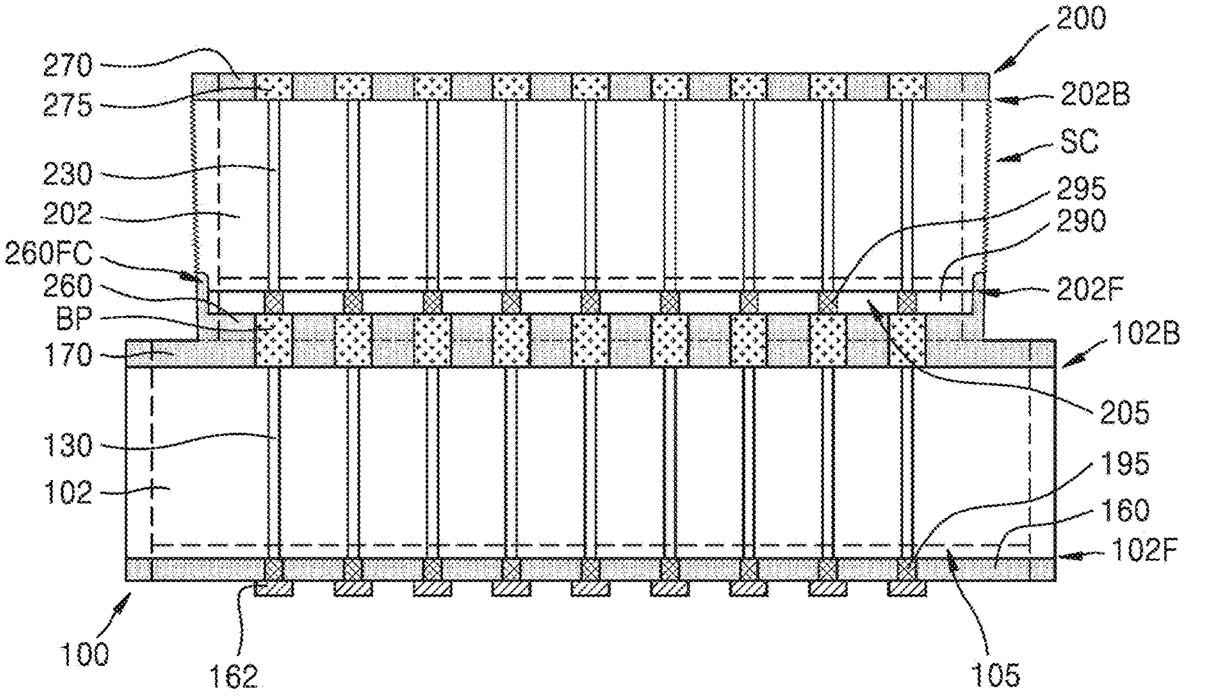

Referring to FIGS. 2A and 2B, in the process of positioning the second semiconductor chip 200 on the first semiconductor chip 100, by applying heat and/or pressure, the first rear insulating layer 170 of the first semiconductor chip 100 may be bonded to the second front insulating layer 260 of the second semiconductor chip 200. The first rear insulating layer 170 of the first semiconductor chip 100 and the second front insulating layer 260 of the second semiconductor chip 200 may be bonded to each other by forming a covalent bond. For example, in the process of positioning the second semiconductor chip 200 on the first semiconductor chip 100, heat of a first temperature may be applied.

Thereafter, by applying heat of a second temperature higher than the first temperature, the plurality of first rear chip connection pads 175 of the first semiconductor chip 100 and the plurality of second front chip connection pads 265 of the second semiconductor chip 200, which correspond to each other, may be bonded to each other, thereby forming a plurality of bonding pads BP. The first rear chip connection pads 175 may correspond to lower portions of the bonding pads BP, and the second front chip connection pads 265 may correspond to upper portions of the bonding pads BP. The plurality of bonding pads BP may be formed as the plurality of first rear chip connection pads 175 and the plurality of second front chip connection pads 265, which correspond to each other, expand by heat to contact each other and then are diffusion-bonded to each other to form a single body through diffusion of metal atoms included therein.

Figure 2C:
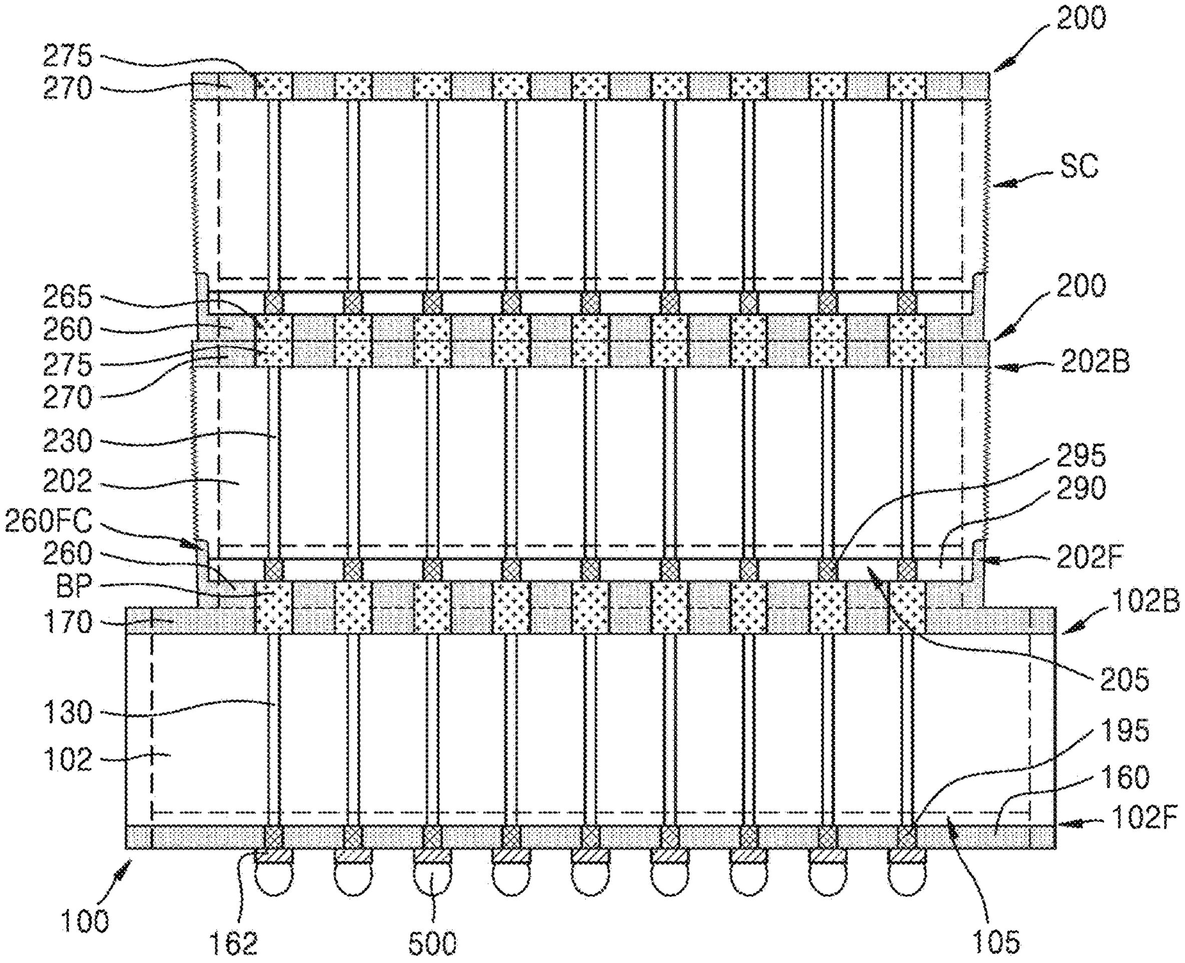

Referring to FIG. 2C, another second semiconductor chip 200 is placed on the second semiconductor chip 200 attached on the first semiconductor chip 100. The another second semiconductor chip 200 may be positioned on the second semiconductor chip 200 attached onto the first semiconductor chip 100, such that a plurality of second rear chip connection pads 275 of the second semiconductor chip 200 on the lower side are in contact with a plurality of second front chip connection pads 265 of the second semiconductor chip 200 (i.e., the other second semiconductor chip 200) on the upper side. The second semiconductor chip 200 on the upper side may be positioned on the second semiconductor chip 200 on the lower side such that the second front insulating layer 260 of the second semiconductor chip 200 on the upper side faces the second rear insulating layer 270 of the second semiconductor chip 200 on the lower side.

Figure 2D:
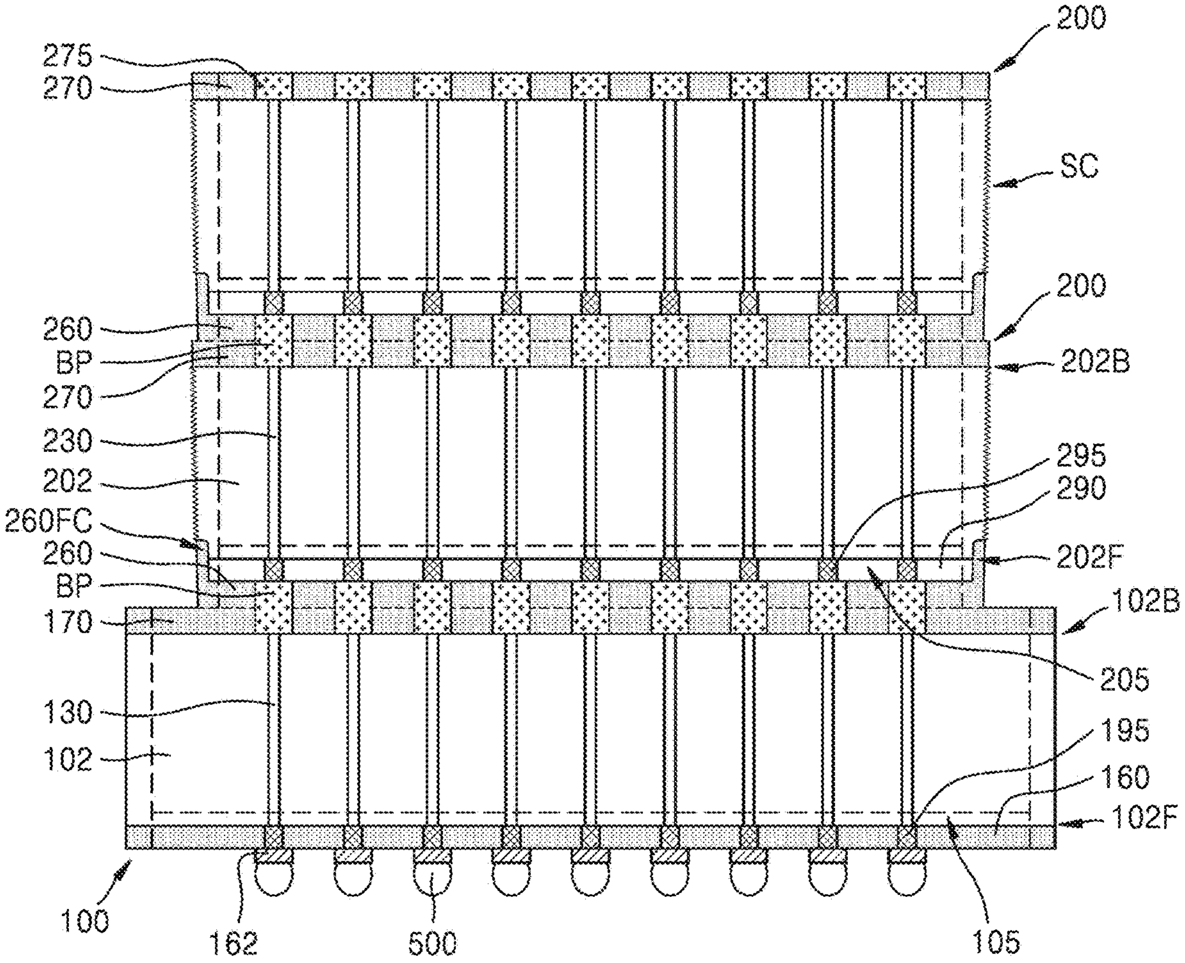

Referring to FIGS. 2C and 2D, in the process of positioning the second semiconductor chip 200 on the upper side on the second semiconductor chip 200 on the lower side, by applying heat and/or pressure, the second rear insulating layer 270 of the second semiconductor chip 200 on the lower side may be bonded to the second front insulating layer 260 of the second semiconductor chip 200 on the upper side. The second rear insulating layer 270 of the second semiconductor chip 200 on the lower side and the second front insulating layer 260 of the second semiconductor chip 200 on the upper side may be bonded to each other by forming a covalent bond. For example, in the process of positioning the second semiconductor chip 200 on the upper side on the second semiconductor chip 200 on the lower side, heat of a first temperature may be applied.

Thereafter, by applying heat of a second temperature higher than the first temperature, the plurality of second rear chip connection pads 275 of the second semiconductor chip 200 on the lower side and the plurality of second front chip connection pads 265 of the second semiconductor chip 200 on the upper side, which correspond to each other, may be bonded to each other, thereby forming a plurality of bonding pads BP. The second rear chip connection pads 275 may correspond to lower portions of the bonding pads BP, and the second front chip connection pads 265 may correspond to upper portions of the bonding pads BP. The plurality of bonding pads BP may be formed as the plurality of second rear chip connection pads 275 and the plurality of second front chip connection pads 265, which correspond to each other, expand by heat to contact each other and then are diffusion-bonded to each other to form a single body through diffusion of metal atoms included therein.

Figure 2E:
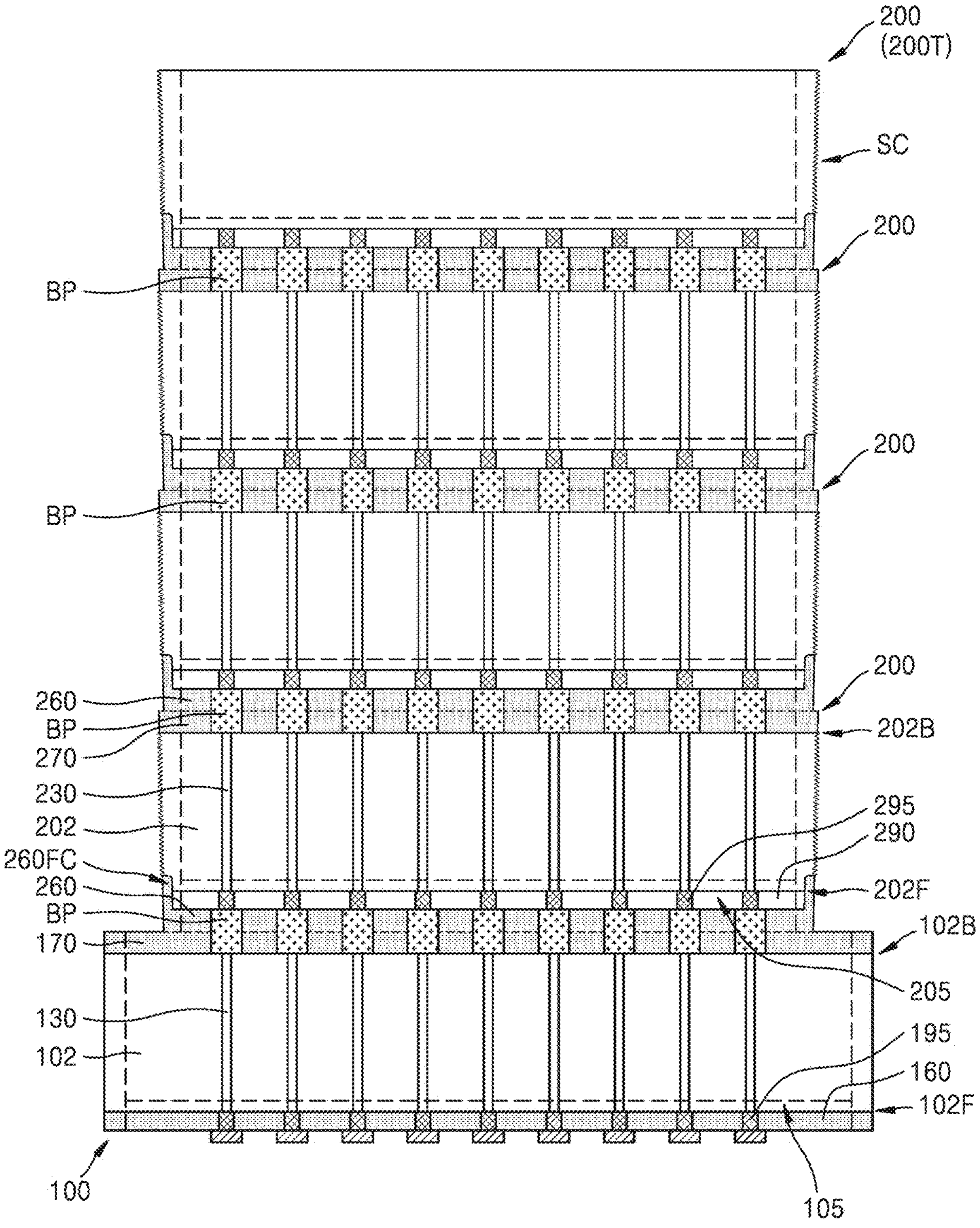

Referring to FIG. 2E, a plurality of second semiconductor chips 200 may be sequentially attached on the first semiconductor chip 100 in a method similar to that described with reference to FIGS. 2C and 2D, and the first semiconductor chip 100 may be electrically connected to the plurality of second semiconductor chips 200 through the plurality of bonding pads BP.

Thereafter, as shown in FIG. 1, the semiconductor package 1 may be formed by attaching a plurality of package connection terminals 500 to a plurality of first front chip connection pads 162.

Referring to FIG. 1 and FIGS. 2A to 2E, in the semiconductor package 1 according to an example embodiment of the inventive concepts, only a portion of the second front insulating layer 260 including a cover insulating portion 260FC may be disposed between the lower surface (e.g., the front surface) of the second semiconductor chip 200 and the second semiconductor substrates 202. Thus, the occurrence of burrs in the plurality of second semiconductor chips 200 formed by singulation of sawing wafers may be reduced. Therefore, in the process of stacking the first semiconductor chip 100 and the plurality of second semiconductor chips 200 by using hybrid bonding, generation of voids due to lifting between the first semiconductor chip 100 and the plurality of second semiconductor chips 200 may be mitigated or prevented. Therefore, the structural reliability of the semiconductor package 1 may be improved, and the electrical connection reliability between the first semiconductor chip 100 and the plurality of second semiconductor chips 200 may be improved.

FIGS. 3A to 3M are cross-sectional views illustrating a method of manufacturing a semiconductor chip, according to an example embodiment. FIGS. 3A to 3M illustrates a method of manufacturing the second semiconductor chip 200 shown in FIG. 1, but the first semiconductor chip 100 may also be formed in a similar manner and will only be briefly described.

Figure 3A:
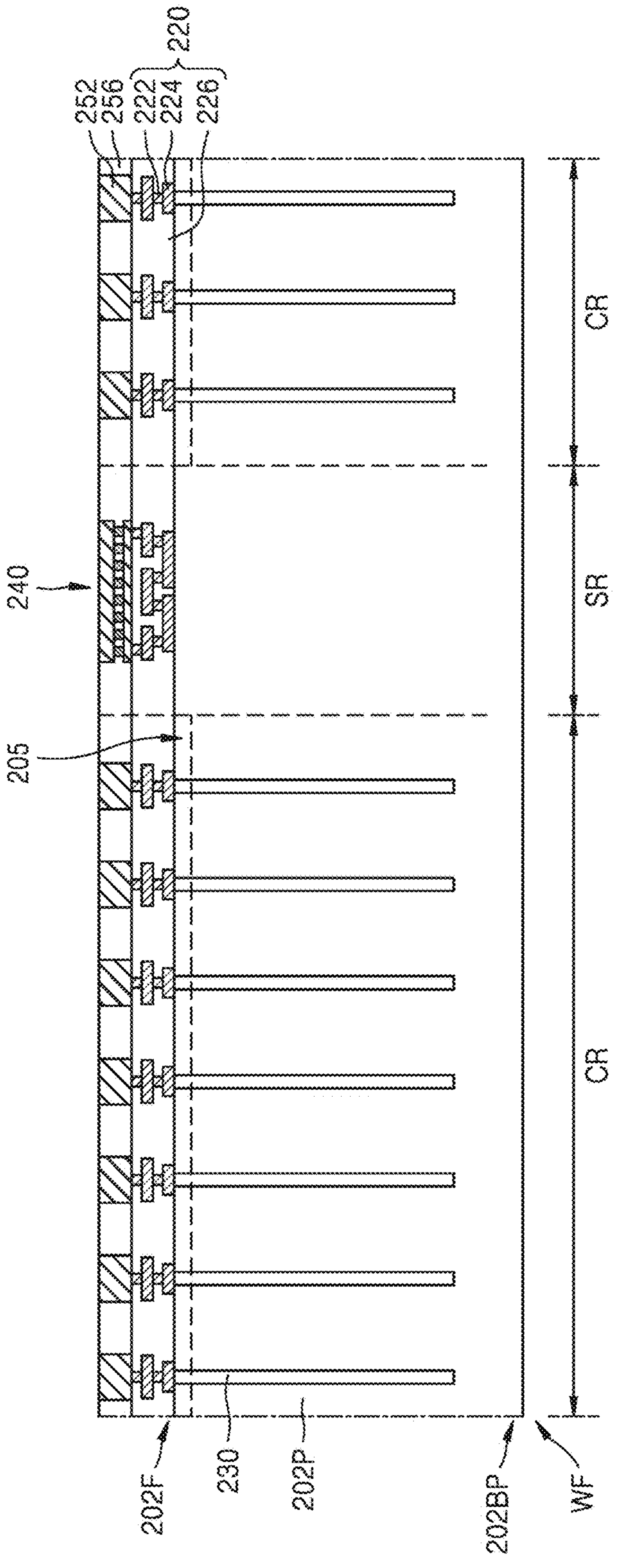
FIGS. 3A to 3M are cross-sectional views illustrating a method of manufacturing a semiconductor chip, according to an example embodiment.

Referring to FIG. 3A, a wafer WF including a plurality of chip regions CR and a scribe lane region SR disposed between the plurality of chip regions CR is prepared. A plurality of second semiconductor devices 205 included in the second semiconductor chip 200 shown in FIG. 1 may be formed in the wafer WF. As described with reference to FIGS. 3K to 3M, a plurality of second semiconductor chips 200 may be formed by singulation of cutting the wafer WF.

The wafer WF may include a preliminary semiconductor substrate 202P having a second active surface 202F and a preliminary non-active surface 202BP opposite to each other, a plurality of second semiconductor devices 205 disposed on the second active surface 202F of the preliminary semiconductor substrate 202P, a plurality of second through electrodes 230 passing through a portion of the preliminary semiconductor substrate 202P, and a wiring layer 220 disposed on the second active surface 202F. Each of the plurality of second semiconductor devices 205 may be formed in each of the plurality of chip regions CR.

The wiring layer 220 may include a plurality of wiring patterns 222, a plurality of wiring vias 224 connected to the plurality of wiring patterns 222, and a lower inter-wire insulating layer 226 surrounding the plurality of wiring patterns 222 and the plurality of wiring vias 224. In some example embodiments, the wiring layer 220 may have a multilayer wiring structure including wiring patterns 222 and wiring vias 224, positioned at different vertical levels. The plurality of wiring patterns 222 and the plurality of wiring vias 224 may include, for example, a metal material, such as copper or tungsten. In some example embodiments, the plurality of wiring patterns 222 and the plurality of wiring vias 232 may include a barrier layer for wiring and a metal layer for wiring. The barrier layer for wiring may include metal, metal nitride, or alloy. The metal layer for wiring may include at least one metal selected from W. Al, Ti, Ta, Ru, Mn, or Cu.

A plurality of wiring connection structures 252 and an upper inter-wire insulating layer 256 surrounding the plurality of wiring connection structures 252 may be provided on the wiring layer 220. Each of the wiring connection structures 252 may include a pattern and a via, which are respectively similar to the wiring patterns 222 and the wiring vias 224. The plurality of wiring connection structures 252 may be electrically connected to the plurality of wiring patterns 222 and/or the plurality of wiring vias 224. The plurality of wiring patterns 222, the plurality of wiring vias 224, and the plurality of wiring connection structures 252 may correspond to the plurality of second wiring structures 295 shown in FIG. 1. The lower inter-wire insulating layer 226 and the upper inter-wire insulating layer 256 may correspond to the inter-wire insulating layer 290 shown in FIG. 1. The lower inter-wire insulating layer 226 and the upper inter-wire insulating layer 256 may include silicon oxide, silicon nitride, silicon oxynitride, an insulating material having a lower dielectric constant than that of the silicon oxide, or a combination thereof. In some example embodiments, the lower inter-wire insulating layer 226 and the upper inter-wire insulating layer 256 may include a tetraethyl orthosilicate (TEOS) layer, or an ultra low K (ULK) layer having an ultra low dielectric constant K of about 2.2 to about 2.4. The ULK layer may include a SiOC layer or a SiCOH layer.

The first semiconductor chip 100 shown in FIG. 1 may include a wiring layer including a plurality of wiring patterns, a plurality of wiring vias, and an inter-wire insulating layer, which is similar to the wiring layer 220 including the plurality of wiring patterns 222, the plurality of wiring vias 224, and the lower inter-wire insulating layer 226. The wiring pattern, the wiring via, the inter-wire insulating layer, and the wiring layer, included in the first semiconductor chip 100, may be referred to as a first wiring pattern, a first wiring via, a first inter-wire insulating layer, and a first wiring layer, respectively. The wiring pattern 222, the wiring via 224, the inter-wire insulating layer 290, and the wiring layer 220, included in the second semiconductor chip 200, may be referred to as a second wiring pattern, a second wiring via, a second inter-wire insulating layer, and a second wiring layer, respectively. The first wiring pattern and the first wiring via may correspond to the first wiring structure 195 shown in FIG. 1, and the first inter-wire insulating layer may correspond to at least portion of the first front insulating layer 160 shown in FIG. 1.

The plurality of second through electrodes 230 may be electrically connected to the second semiconductor device 205, the wiring pattern 222, and/or the wiring via 224. The plurality of second through electrodes 230 may extend into the preliminary semiconductor substrate 202P from the second active surface 202F, but may not extend to the preliminary non-active surface 202BP.

A Test Element Group (TEG) 240 may be disposed on the second active surface 202F in the scribe lane region SR. The TEG 240 may include structures that are similar to the wiring pattern 222, the wiring via 224, and the wiring connection structure 252, and may be surrounded by the lower inter-wire insulating layer 226 and the upper inter-wire insulating layer 256, which are formed in the scribe lane region SR.

Figure 3B:
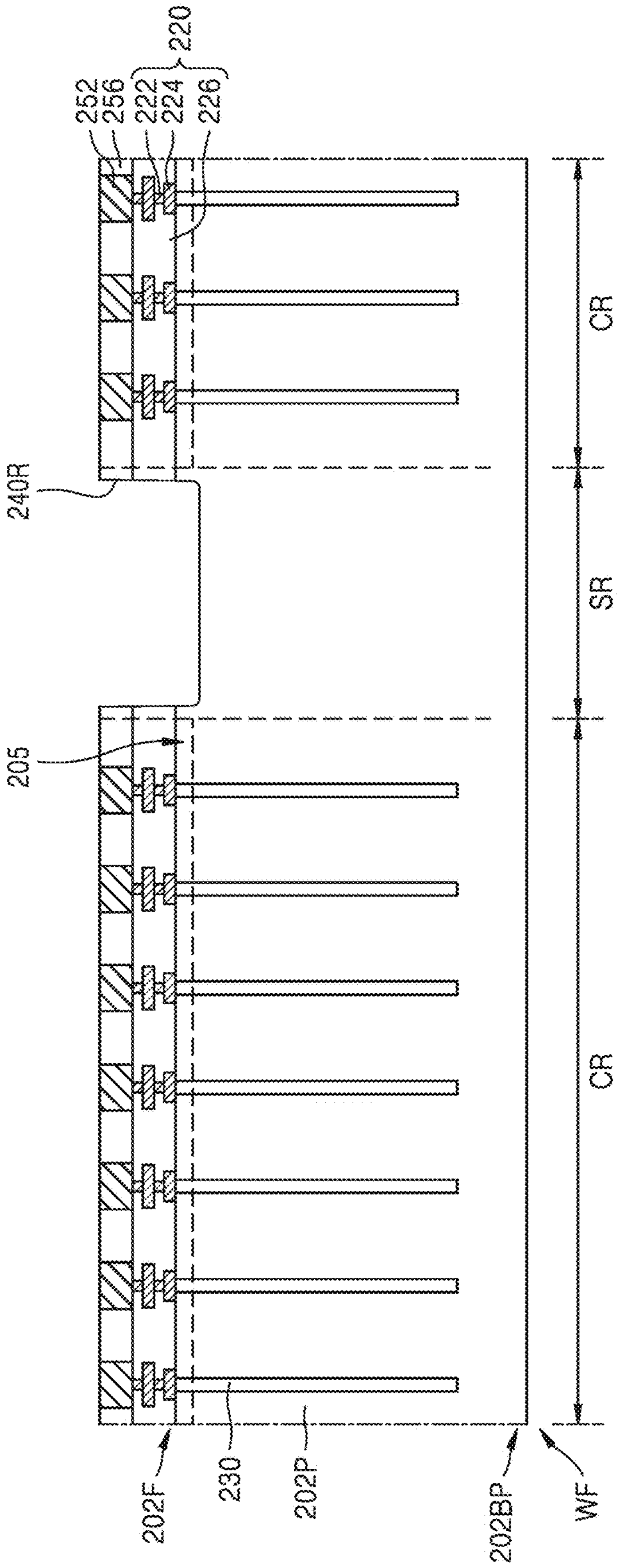

Referring to FIGS. 3A and 3B, in the scribe lane region SR, the TEG 240, and a portion of the lower inter-wire insulating layer 226 and a portion of the upper inter-wire insulating layer 256, which are disposed around the TEG 240, are removed to thereby form a removal recess 240R. In the process of forming the removal recess 240R, all of the TEG 240 may be removed. The removal recess 240R may be formed by removing the TEG 240, and a portion of the lower inter-wire insulating layer 226 and a portion of the upper inter-wire insulating layer 256, which are disposed around the TEG 240, by using a blade. The removal recess 240R may be formed to extend along an edge of the chip region CR to surround the chip region CR.

The preliminary semiconductor substrate 202P may be exposed at the bottom surface of the removal recess 240R. The removal recess 240R may pass through the second active surface 202F of the preliminary semiconductor substrate 202P and extend into the preliminary semiconductor substrate 202P. For example, the bottom surface of the removal recess 240R may be positioned at a lower vertical level than that of the second active surface 202F. In some example embodiments, the removal recess 240R may be formed such that a corner portion of the bottom surface has a round shape.

Figure 3C:
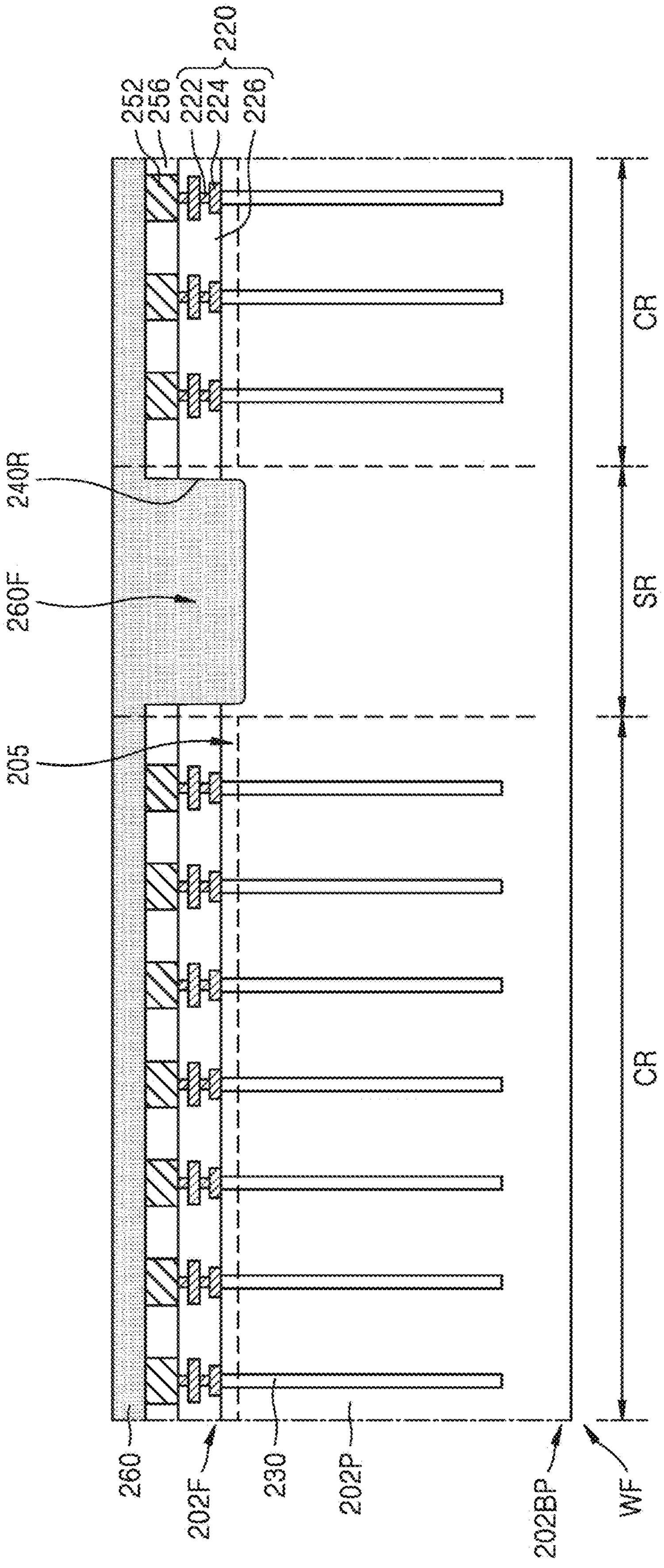

Referring to FIG. 3C, a second front insulating layer 260 is formed to fill the removal recess 240R and cover the plurality of wiring connection structures 252 and the upper inter-wire insulating layer 256. A portion of the second front insulating layer 260 that fills the removal recess 240R may be referred to as a filling insulating portion 260F. The second front insulating layer 260 may include any one of SiO, SiN, SiCN, SiCO, and a polymer material. For example, the second front insulating layer 260 may include silicon oxide.

Figure 3D:
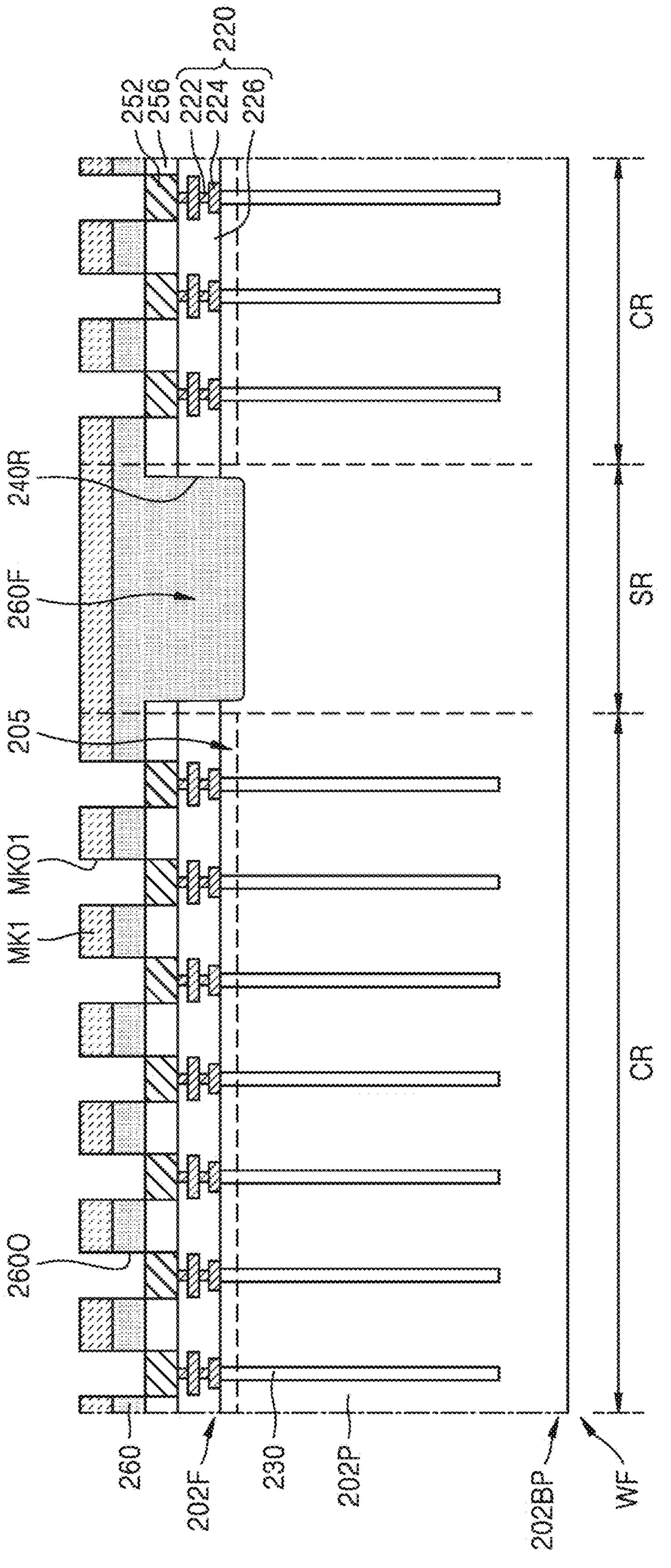

Referring to FIGS. 3C and 3D, a first mask layer MK1 having a plurality of first mask openings MKO1 is formed on the second front insulating layer 260. The plurality of first mask openings MKO1 may overlap the plurality of wiring connection structures 252 in a vertical direction.

A portion of the second front insulating layer 260 is removed using the first mask layer MK1 having the plurality of first mask openings MKO1 as an etch mask, thereby forming a plurality of through openings 2600 in the second front insulating layer 260. The plurality of through openings 2600 may pass through the second front insulating layer 260. The plurality of wiring connection structures 252 may be exposed at the bottom surfaces of the plurality of through openings 2600. After the plurality of through openings 2600 are formed, the first mask layer MK1 may be removed.

Figure 3E:
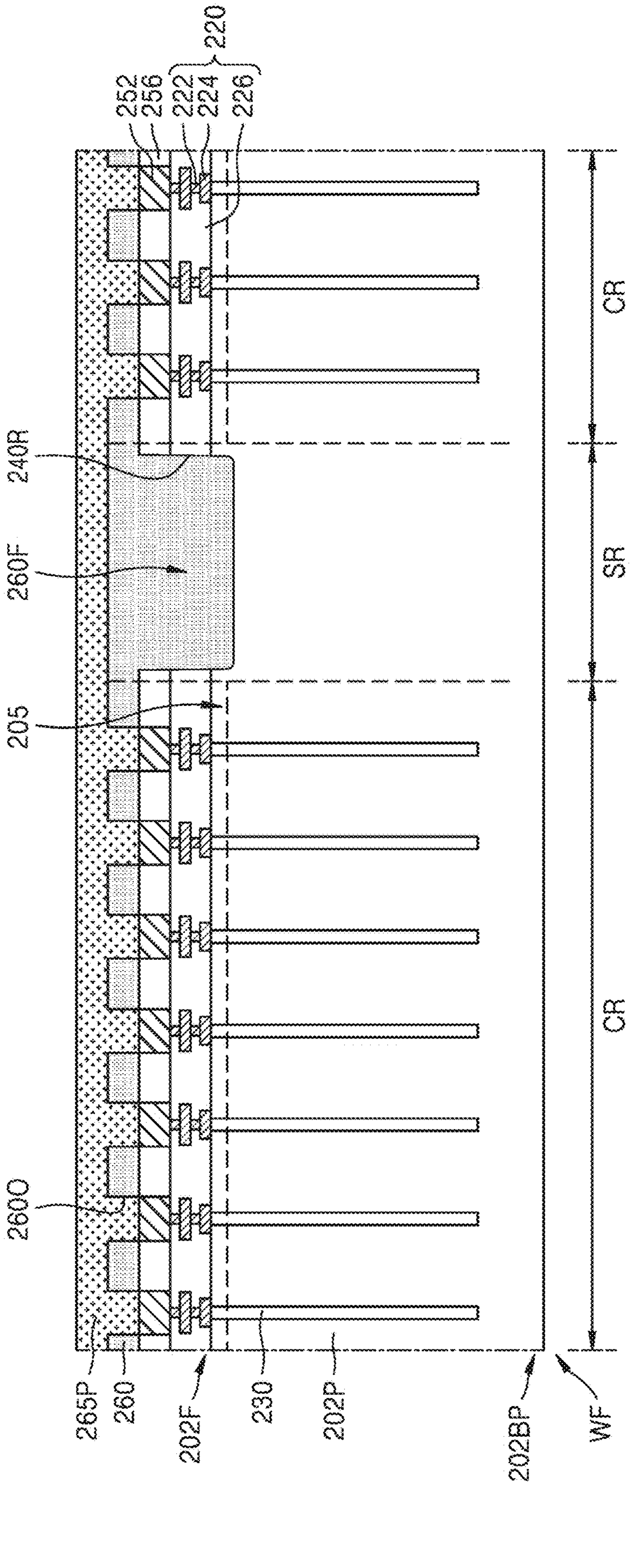

Referring to FIG. 3E, a first conductive material layer 265P is formed to fill the plurality of through openings 2600 and cover the second front insulating layer 260. For example, the first conductive material layer 265P may include Cu. The first conductive material layer 265P may be in contact with the plurality of wiring connection structures 252 exposed at the bottom surfaces of the plurality of through openings 2600.

Figure 3F:
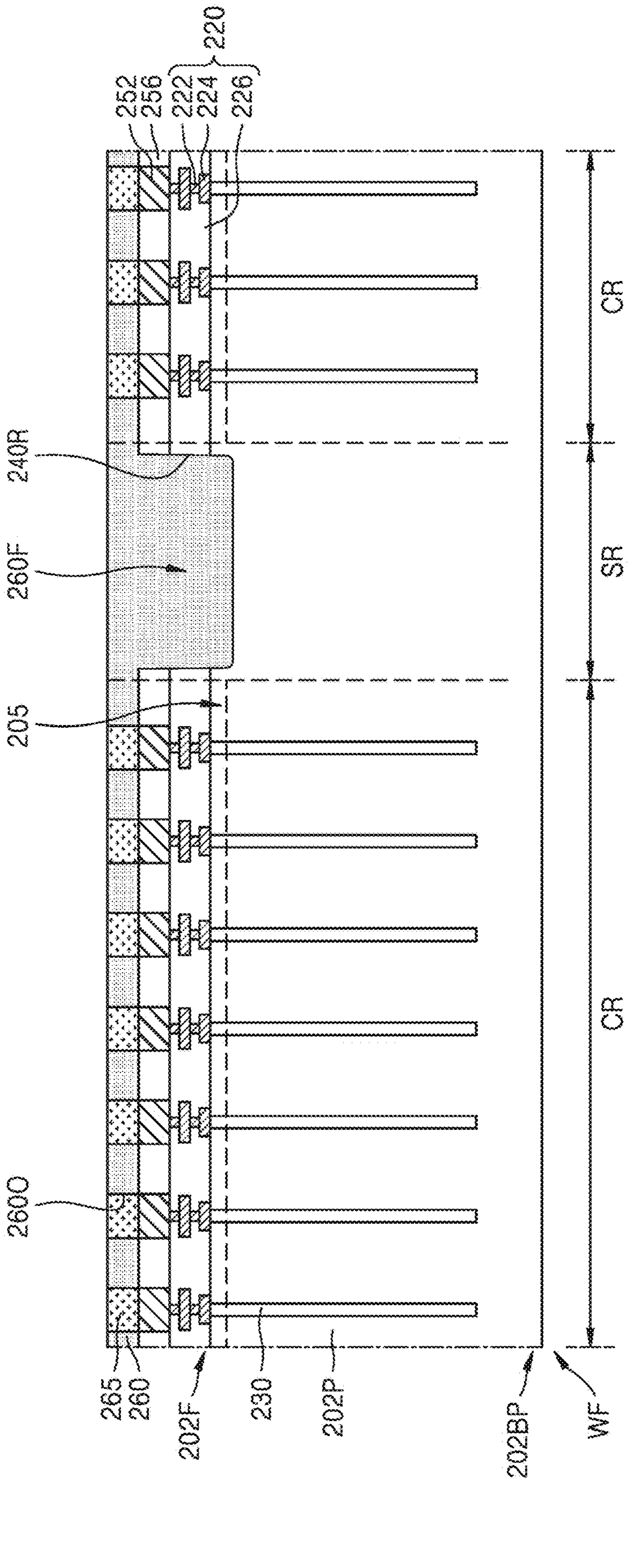

Referring to FIGS. 3E and 3F, a plurality of second front chip connection pads 265 filling the plurality of through openings 2600 are formed by removing a portion of the first conductive material layer 265P. The plurality of second front chip connection pads 265 may be formed by removing a portion of the first conductive material layer 265P until the second front insulating layer 260 is exposed. For example, the plurality of second front chip connection pads 265 may be formed by removing a portion of the first conductive material layer 265P by performing a chemical mechanical polishing (CMP) process.

Figure 3G:
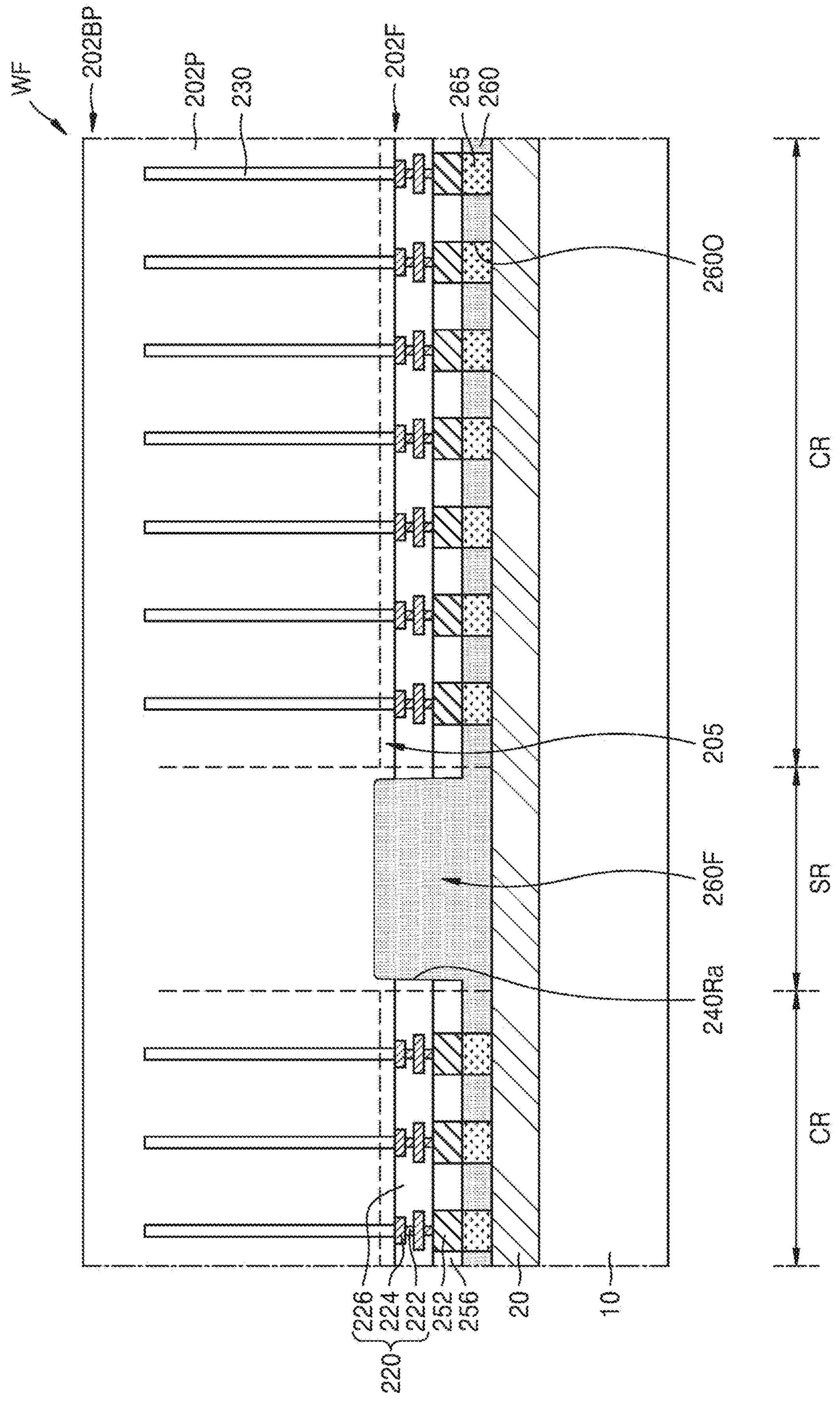

Referring to FIGS. 3F and 3G, a resultant structure of FIG. 3F is turned upside down and attached to a carrier substrate 10 to which a release film 20 is attached. In FIGS. 3A to 3F, the preliminary non-active surface 202BP faces downward, but in FIG. 3G, the preliminary non-active surface 202BP faces upward.

When the carrier substrate 10 is to be separated and removed by laser ablation later, the carrier substrate 10 may be a light-transmitting substrate. Optionally, when the carrier substrate 10 is to be separated and removed by heating later, the carrier substrate 10 may be a heat-resistant substrate. In some example embodiments, the carrier substrate 10 may be a glass substrate. In some other embodiments, the carrier substrate 10 may include a heat-resistant organic polymer material, such as polyimide (PI), poly(etheretherketone) (PEEK), poly(ethersulfone) (PES), or poly(phenylene sulfide) (PPS), but is not limited thereto. For example, the release film 20 may be a laser reaction layer capable of separating the carrier substrate 10 by being vaporized in response to laser irradiation later, or a thermal reaction layer capable of separating the carrier substrate 10 by being reacted and vaporized by heating.

Figure 3H:
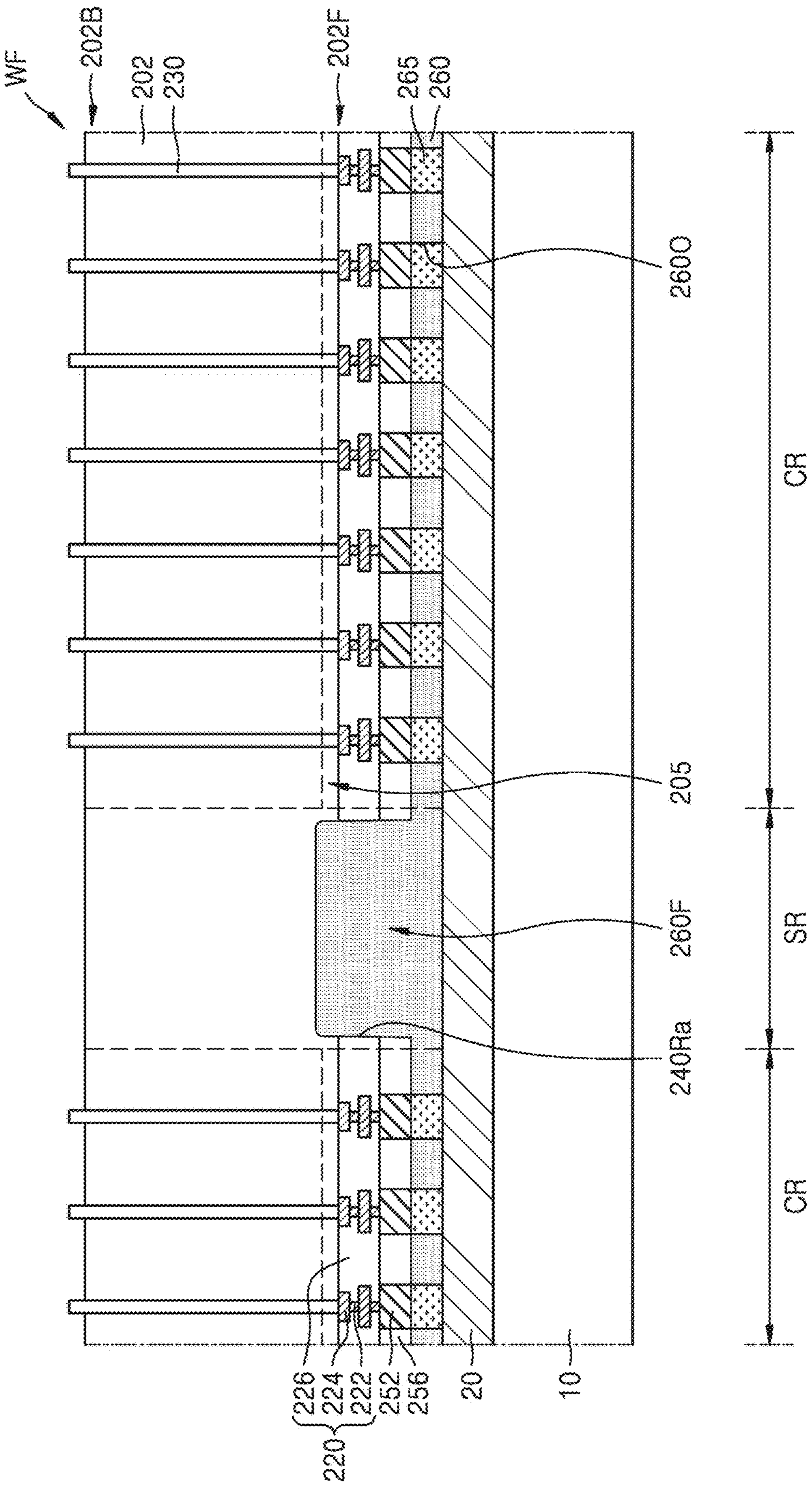

Referring to FIGS. 3G and 3H, an upper portion of the preliminary semiconductor substrate 202P is removed to expose the plurality of second through electrodes 230. For example, a second semiconductor substrate 202 having a second non-active surface 202B may be formed by removing an upper portion of the preliminary semiconductor substrate 202P from the preliminary non-active surface 202BP. Upper portions of the plurality of second through electrodes 230 may protrude upward from the second non-active surface 202B of the second semiconductor substrate 202.

Figure 3I:
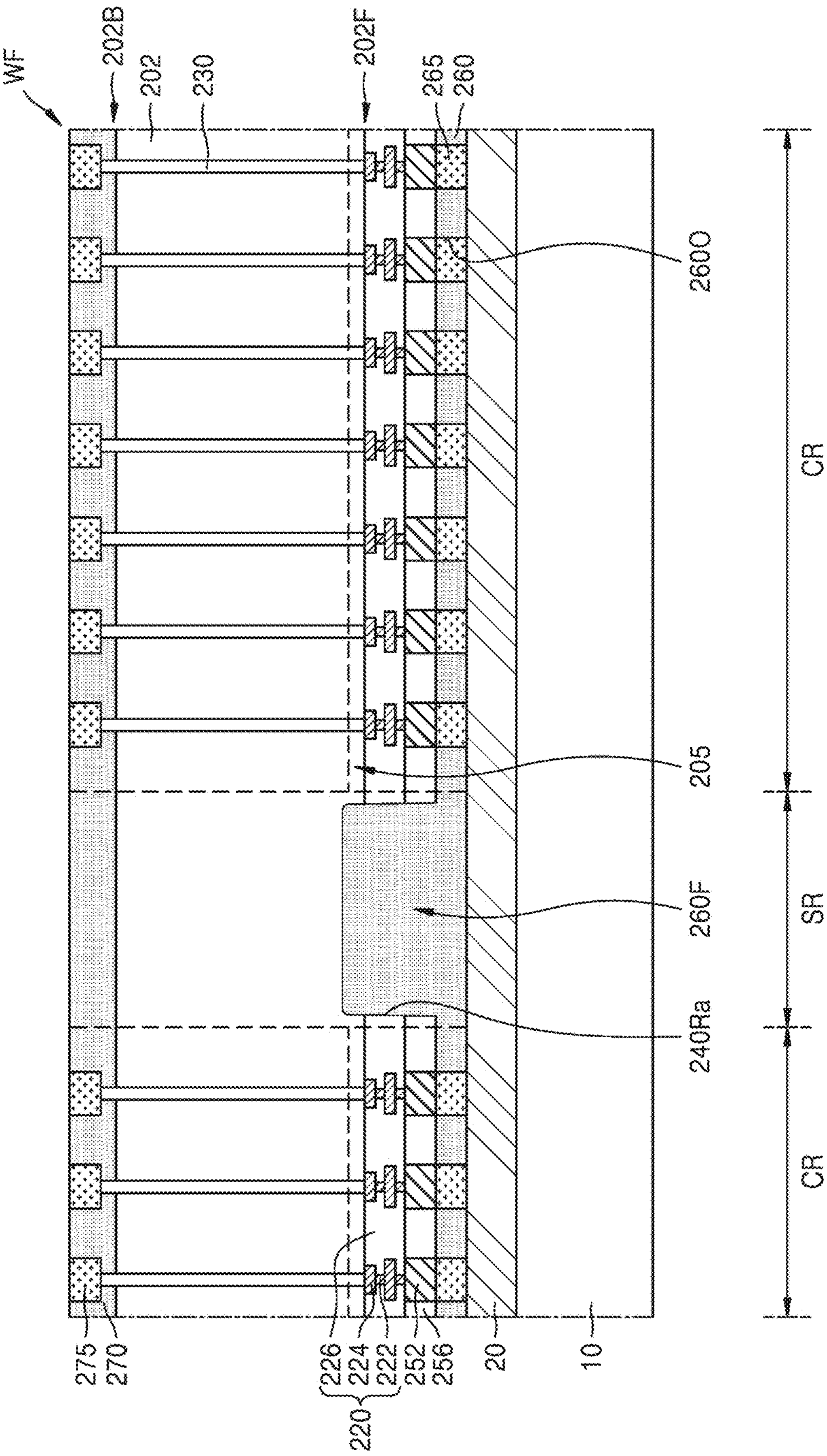

Referring to FIG. 3I, a plurality of second rear chip connection pads 275 and a second rear insulating layer 270 surrounding the plurality of second rear chip connection pads 275 are formed on the second non-active surface 202B of the second semiconductor substrate 202. The plurality of second rear chip connection pads 275 may be formed on the second non-active surface 202B of the second semiconductor substrate 202 to be connected to the plurality of second through electrodes 230.

For example, the plurality of second rear chip connection pads 275 may include Cu. The second rear insulating layer 270 may include any one of SiO, SiN, SiCN, SiCO, and a polymer material. For example, the second rear insulating layer 270 may include silicon oxide.

Although it is illustrated in FIG. 3I that the plurality of second rear chip connection pads 275 are apart from the second non-active surface 202B of the second semiconductor substrate 202, the inventive concepts are not limited thereto. For example, the plurality of second rear chip connection pads 275 may be formed to contact the second non-active surface 202B of the second semiconductor substrate 202 and to surround upper portions of the plurality of second through electrodes 230 protruding upward from the second non-active surface 202B of the second semiconductor substrate 202.

Figure 3J:
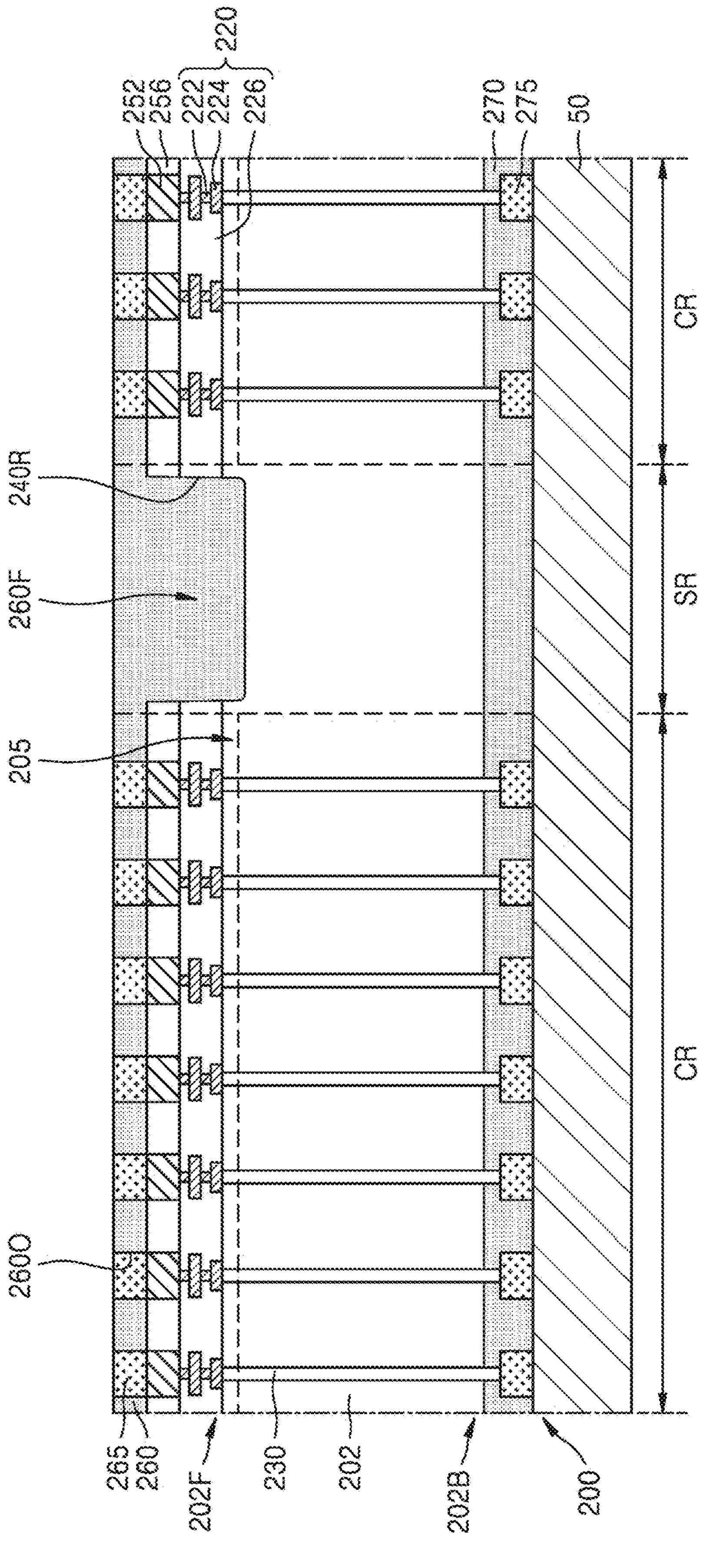

Referring to FIGS. 3I and 3J, after the wafer WF is separated from the carrier substrate 10 to which the release film 20 is attached, the wafer WF is turned upside down and attached to a dicing film 50. In FIGS. 3H to 3I, the second non-active surface 202B faces upward, but in FIG. 3J, the second non-active surface 202B faces downward.

Figure 3K:
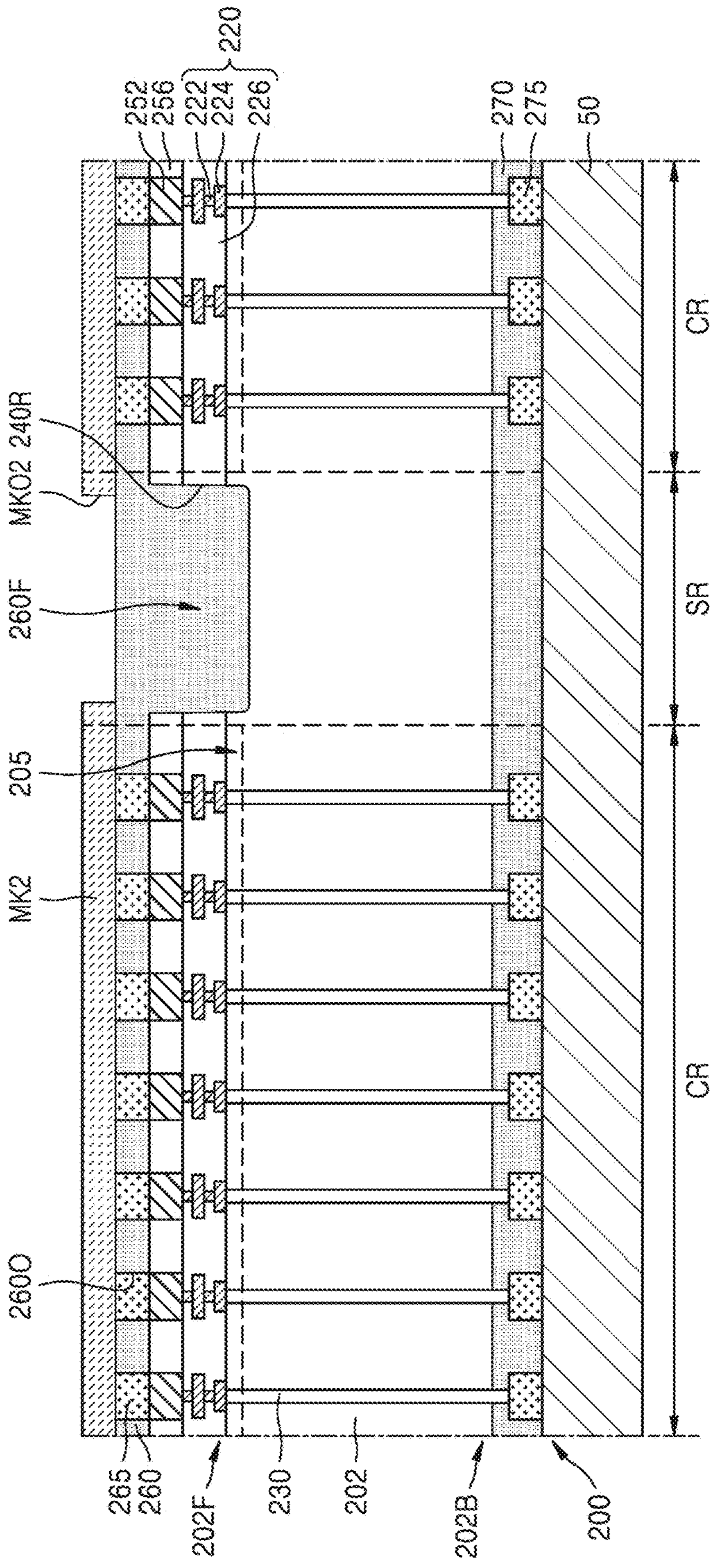

Referring to FIG. 3K, a second mask layer MK2 having a second mask opening MKO2 is formed on the plurality of second front chip connection pads 265 and the second front insulating layer 260. A plurality of second mask openings MKO2 may be positioned in the scribe lane region SR to overlap a portion of the filling insulating portion 260F in the vertical direction.

Figure 3L:
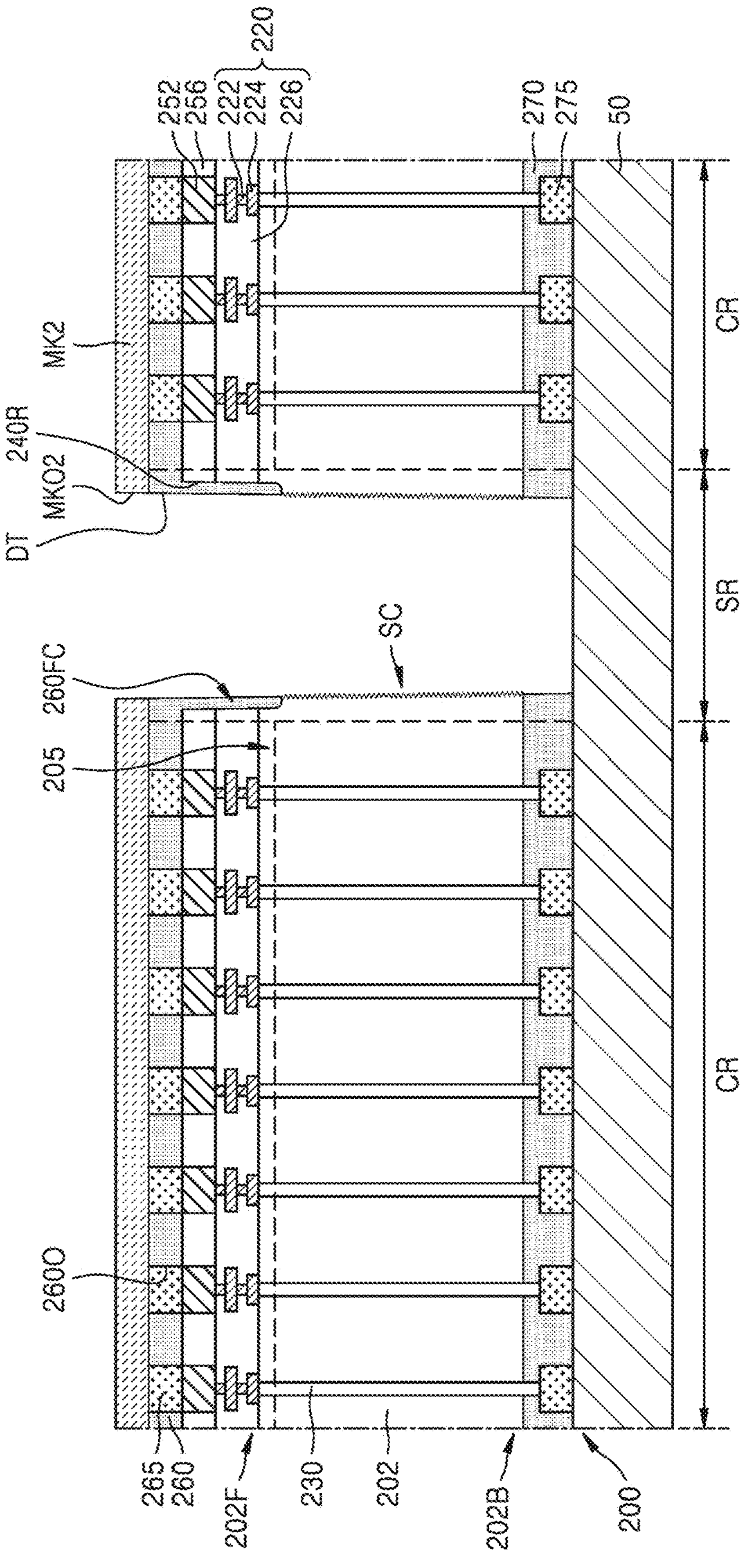

Referring to FIGS. 3K and 3L, a portion of the filling insulating portion 260F, a portion of the second semiconductor substrate 202, and a portion of the second rear insulating layer 270 are removed using the second mask layer MK2 having the second mask opening MKO2 as an etching mask to form a dicing trench DT. The dicing trench DT may pass through the wafer WF and divide the wafer WF into a plurality of second semiconductor chips 200. In other words, singulation of cutting the wafer WF may be performed by forming the dicing trench DT. After the dicing trench DT is formed, the second mask layer MK2 may be removed.

A portion of the filling insulating portion 260F may remain as the cover insulating portion 260FC without being removed in the process of forming the dicing trench DT. The cover insulating portion 260FC may be formed to extend along the side surface of the second semiconductor chip 200. The cover insulating portion 260FC may pass through the second active surface 202F of the second semiconductor substrate 202 and extend into the second semiconductor substrate 202.

In some example embodiments, the dicing trench DT may be formed by plasma etching. For example, the dicing trench DT may be formed by removing a portion of the filling insulating portion 260F, a portion of the second semiconductor substrate 202, and a portion of the second rear insulating layer 270 by performing plasma etching using the second mask layer MK2 having the second mask opening MKO2 as an etch mask. In some example embodiments, the dicing trench DT may extend from the upper surface of the second front insulating layer 260, that is, the upper surface of the filling insulating portion 260F, to the lower surface of the second rear insulating layer 270, and may have a reduced horizontal width than the scribe lane region SR.

A side surface of the second front insulating layer 260 exposed in the dicing trench DT, that is, a side surface of the cover insulating portion 260FC may have a substantially flat surface. A side surface of the second rear insulating layer 270 exposed in the dicing trench DT may have a substantially flat surface. A side surface of the second semiconductor substrate 202 exposed in the dicing trench DT may be a rough surface having a scallop SC.

Figure 3M:
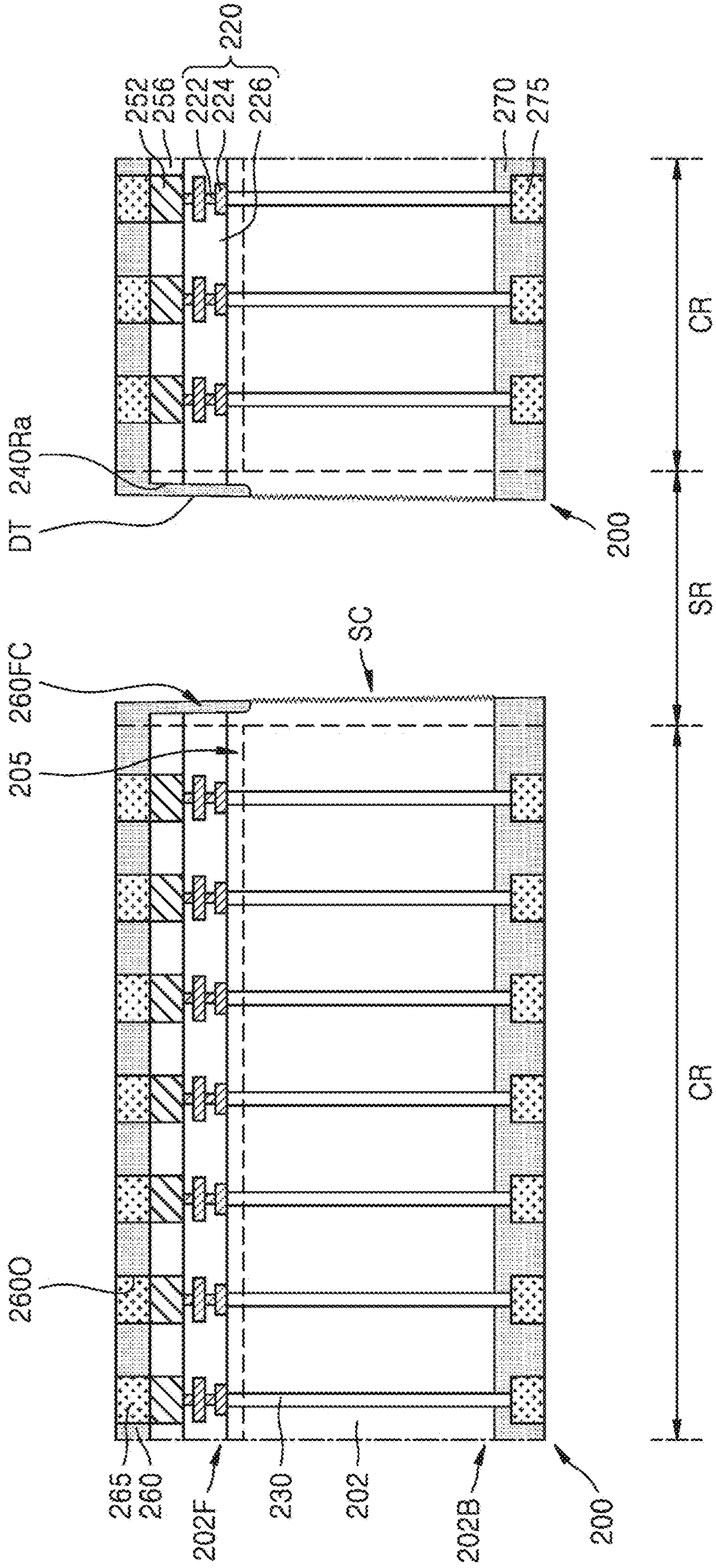

Referring to FIGS. 3L and 3M, the plurality of second semiconductor chips 200 are separated from the dicing film 50.

The plurality of first rear chip connection pads 175 and the first rear insulating layer 170 included in the first semiconductor chip 100 shown in FIG. 2A may be formed in a similar manner to those of the plurality of second rear chip connection pads 275 and the second rear insulating layer 270, shown in FIG. 31. In some example embodiments, structures that are similar to the second front insulating layer 260 including the cover insulating portion 260FC and the plurality of second front chip connection pads 265, described with reference to FIGS. 3A to 3M, may also be formed in the first semiconductor chip 100.

FIGS. 4A to 4M are cross-sectional views illustrating a method of manufacturing a semiconductor chip, according to an example embodiment. FIGS. 4A to 4M illustrate a method of manufacturing the second semiconductor chip 200 shown in FIG. 1. In FIGS. 4A to 4M, the same reference numerals as those in FIGS. 3A to 3M denote the same members as those in FIGS. 3A to 3M, and repeated descriptions thereof may be omitted.

Figure 4A:
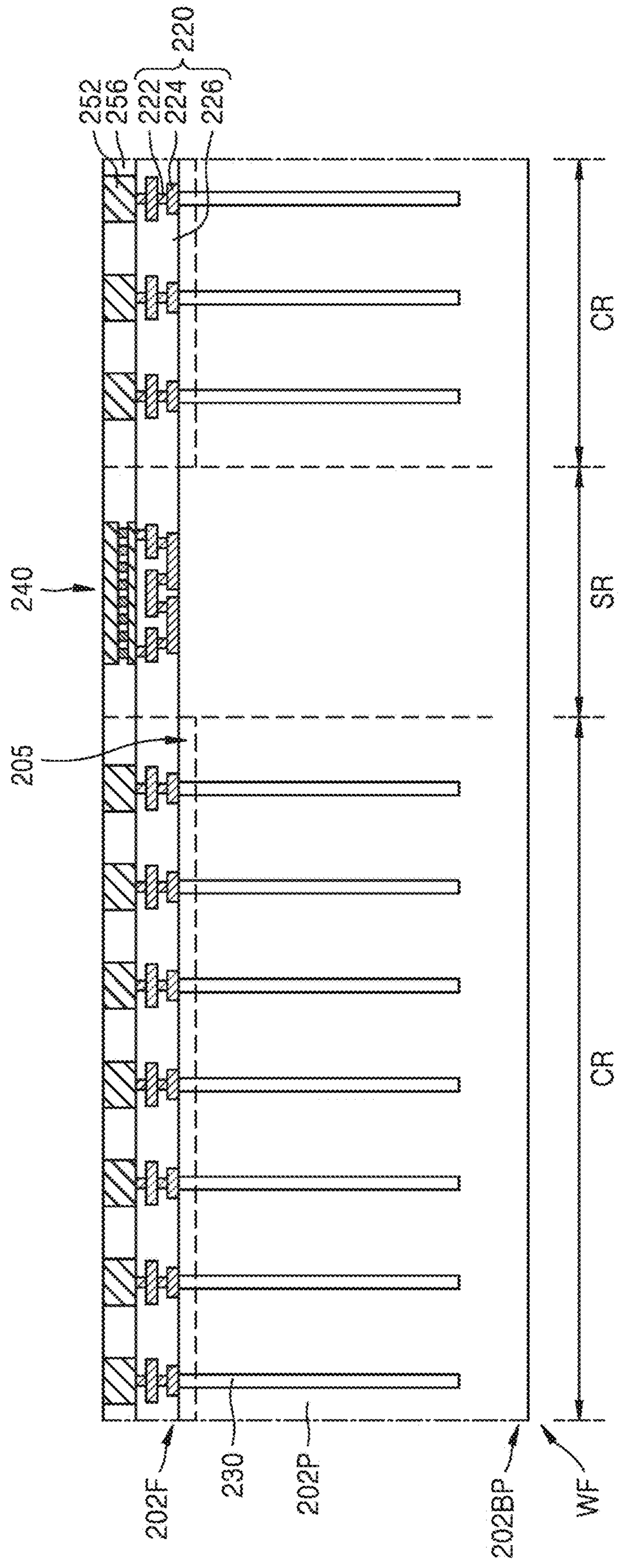
FIGS. 4A to 4M are cross-sectional views illustrating a method of manufacturing a semiconductor chip, according to an example embodiment.

Referring to FIG. 4A, a wafer WF including a plurality of chip regions CR and a scribe lane region SR disposed between the plurality of chip regions CR is prepared. A plurality of second semiconductor devices 205 included in the second semiconductor chip 200 shown in FIG. 1 may be formed in the wafer WF. As described with reference to FIGS. 3K to 3M, a plurality of second semiconductor chips 200 may be formed by singulation of cutting the wafer WF.

The wafer WF may include a preliminary semiconductor substrate 202P having a second active surface 202F and a preliminary non-active surface 202BP opposite to each other, a plurality of second semiconductor devices 205 disposed on the second active surface 202F of the preliminary semiconductor substrate 202P, a plurality of second through electrodes 230 passing through a portion of the preliminary semiconductor substrate 202P, and a wiring layer 220 disposed on the second active surface 202F. Each of the plurality of second semiconductor devices 205 may be formed in each of the plurality of chip regions CR.

The plurality of second through electrodes 230 may be electrically connected to the second semiconductor device 205, a wiring pattern 222, and/or a wiring via 224. The plurality of second penetration electrodes 230 may extend into the preliminary semiconductor substrate 202P from the second active surface 202F, but may not extend to the preliminary non-active surface 202BP.

A TEG 240 may be disposed on the second active surface 202F in the scribe lane region SR. The TEG 240 may include a configuration that is similar to the wiring pattern 222, the wiring via 224, and the wiring connection structure 252, and may be surrounded by the lower inter-wire insulating layer 226 and the upper inter-wire insulating layer 256, which are formed in the scribe lane region SR.

Figure 4B:
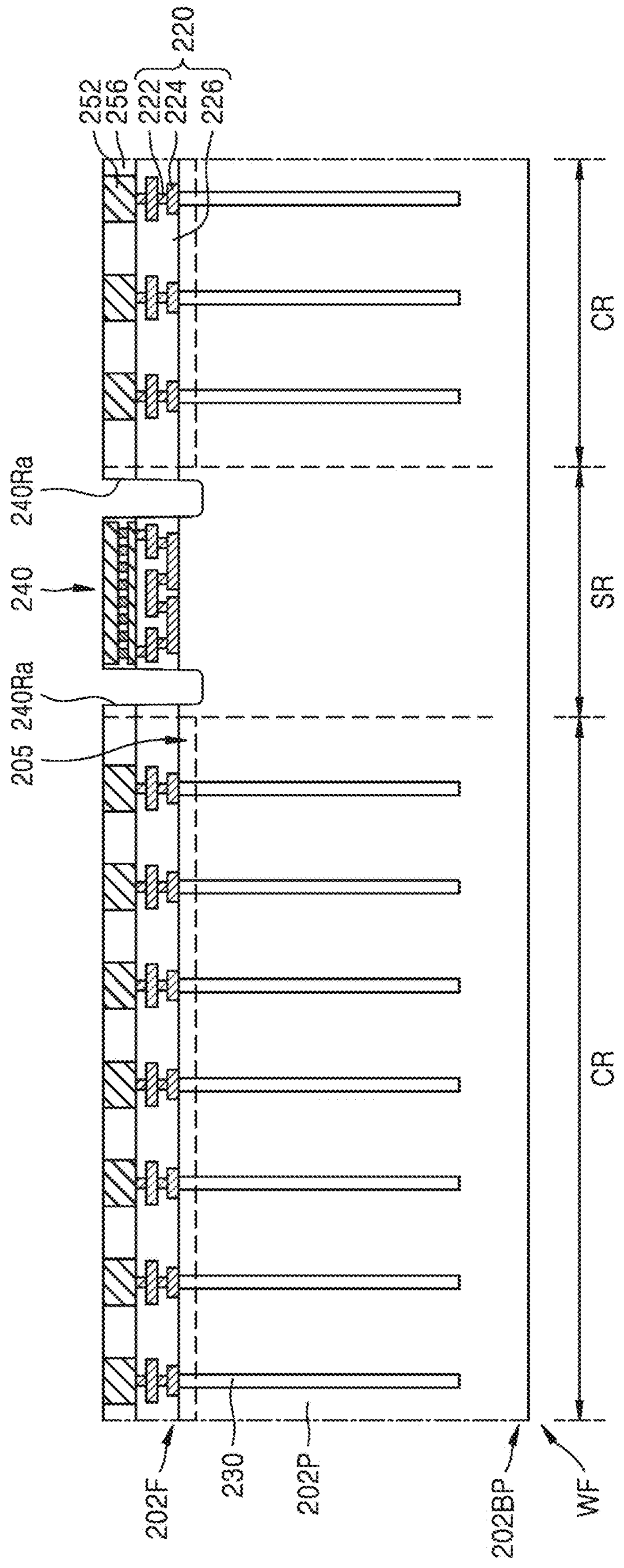

Referring to FIGS. 4A and 4B, in the scribe lane region SR, a portion of the lower inter-wire insulating layer 226 and a portion of the upper inter-wire insulating layer 256, which are disposed around the TEG 240, are removed to thereby form a removal recess 240Ra. In the process of forming the removal recess 240Ra, the TEG 240 may not be removed. The removal recess 240Ra may be formed to be apart from the TEG 240 so that the TEG 240 is not exposed in the removal recess 240Ra. The removal recess 240Ra may be formed by removing a portion of the lower inter-wire insulation layer 226 and a portion of the upper inter-wire insulation layer 256, which are disposed around the TEG 240, by using a laser. The removal recess 240Ra may be formed to extend along an edge of the chip region CR to surround the scribe lane region SR.

The preliminary semiconductor substrate 202P may be exposed at the bottom surface of the removal recess 240Ra. The removal recess 240Ra may pass through the second active surface 202F of the preliminary semiconductor substrate 202P and extend into the preliminary semiconductor substrate 202P. For example, the bottom surface of the removal recess 240Ra may be positioned at a lower vertical level than that of the second active surface 202F. In some example embodiments, the removal recess 240Ra may be formed such that a corner portion of the bottom surface has a round shape.

Figure 4C:
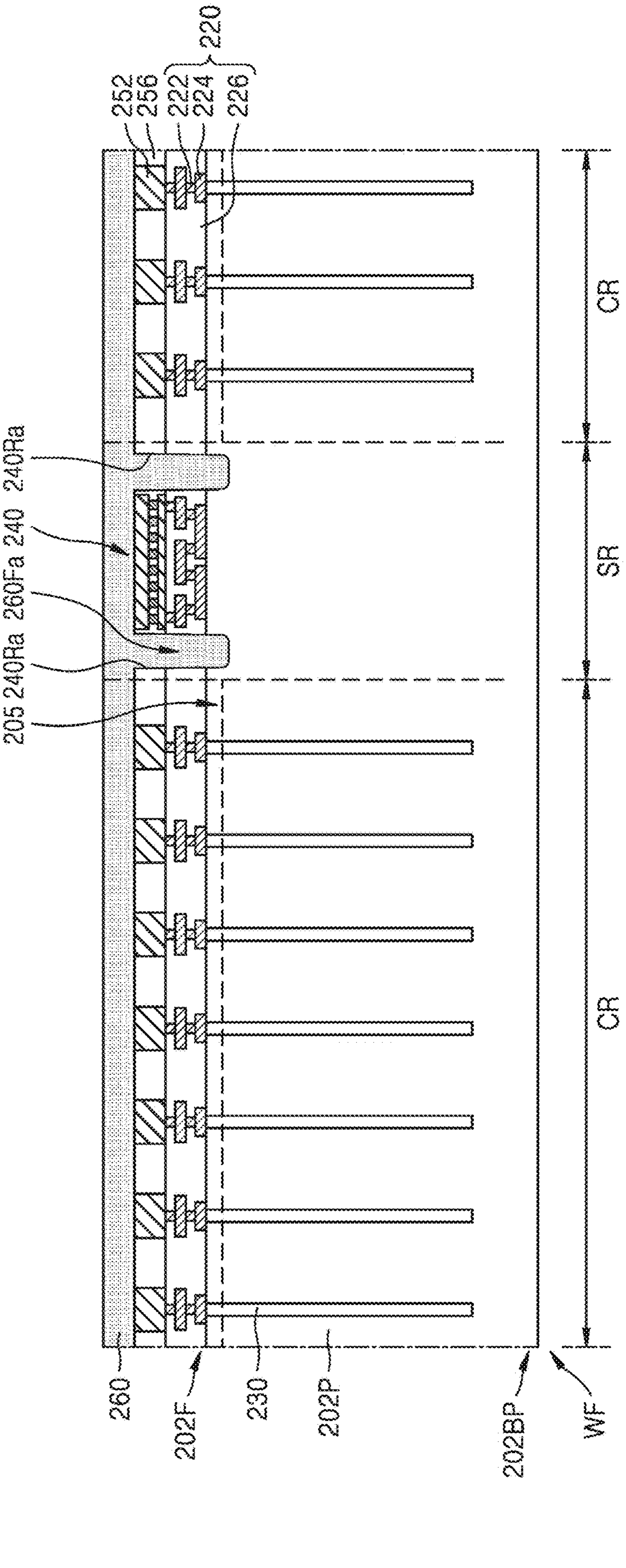

Referring to FIG. 4C, a second front insulating layer 260 is formed to fill the removal recess 240Ra and cover the plurality of wire connection structures 252 and the upper inter-wire insulating layer 256. A portion of the second front insulating layer 260 that fills the removal recess 240Ra may be referred to as a filling insulating portion 260Fa.

Figure 4D:
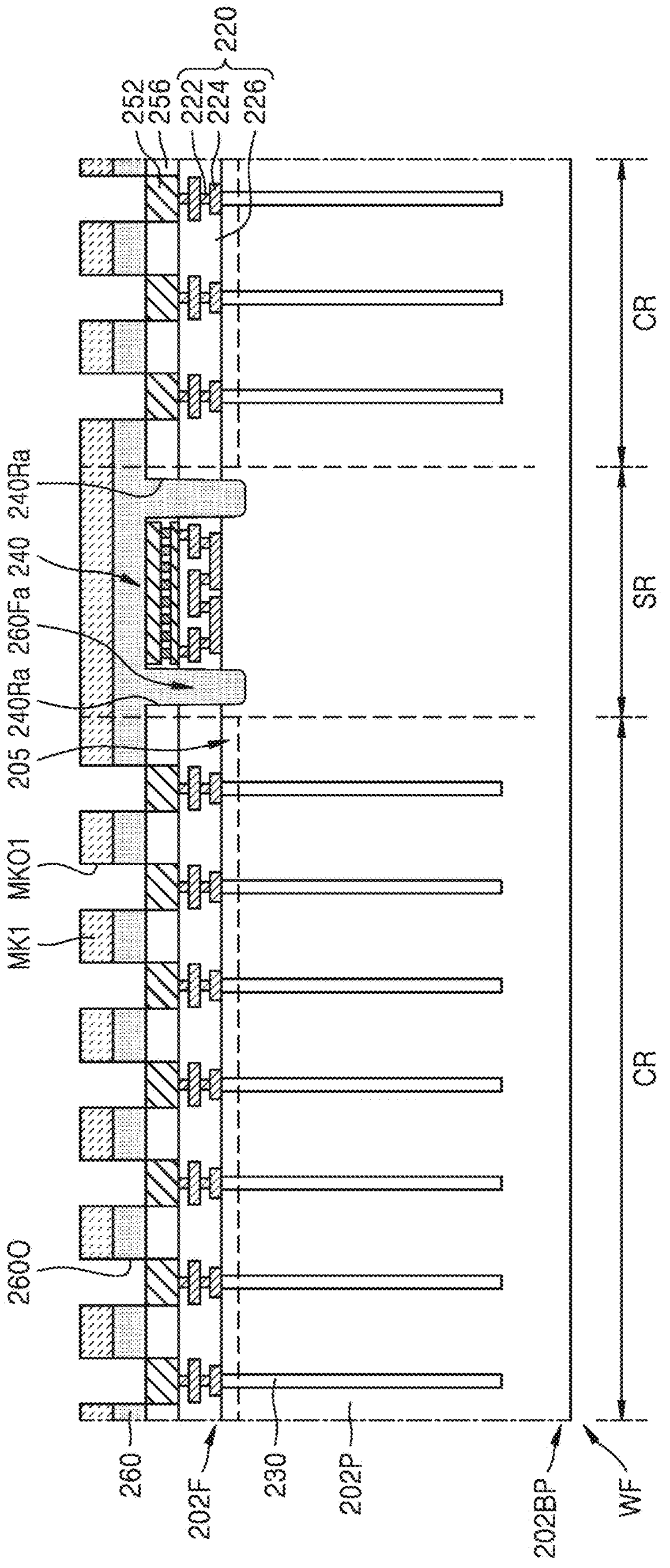

Referring to FIGS. 4C and 4D, a first mask layer MK1 having a plurality of first mask openings MKO1 is formed on the second front insulating layer 260. The plurality of first mask openings MKO1 may overlap the plurality of wiring connection structures 252 in a vertical direction.

A portion of the second front insulating layer 260 is removed using the first mask layer MK1 having the plurality of first mask openings MKO1 as an etching mask, thereby forming a plurality of through openings 2600 in the second front insulating layer 260. The plurality of through openings 2600 may pass through the second front insulating layer 260. The plurality of wiring connection structures 252 may be exposed at the bottom surfaces of the plurality of through openings 2600. After the plurality of through openings 2600 are formed, the first mask layer MK1 may be removed.

Figure 4E:
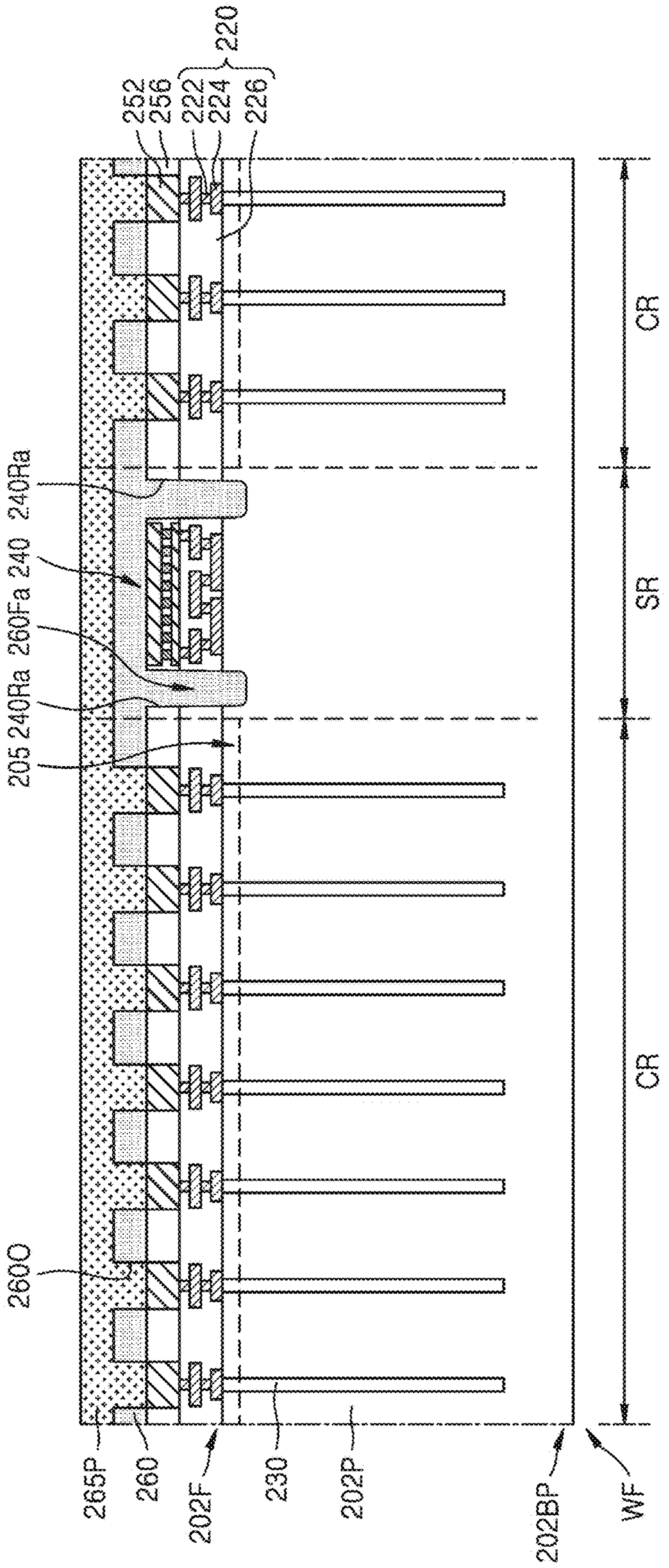

Referring to FIG. 4E, a first conductive material layer 265P is formed to fill the plurality of through openings 2600 and cover the second front insulating layer 260. The first conductive material layer 265P may be in contact with the plurality of wiring connection structures 252 exposed at the bottom surfaces of the plurality of through openings 2600.

Figure 4F:
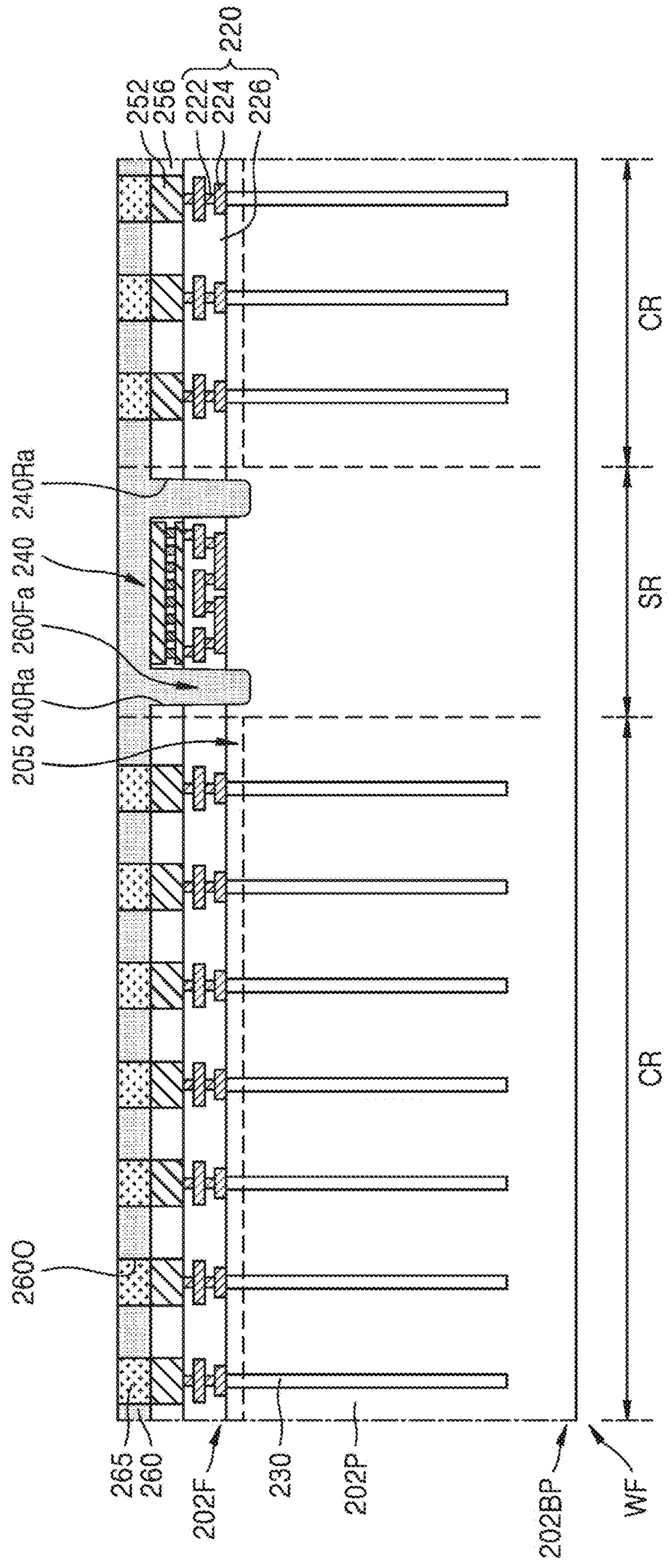

Referring to FIGS. 4E and 4F, a plurality of second front chip connection pads 265 filling the plurality of through openings 2600 are formed by removing a portion of the first conductive material layer 265P. The plurality of second front chip connection pads 265 may be formed by removing a portion of the first conductive material layer 265P until the second front insulating layer 260 is exposed.

Figure 4G:
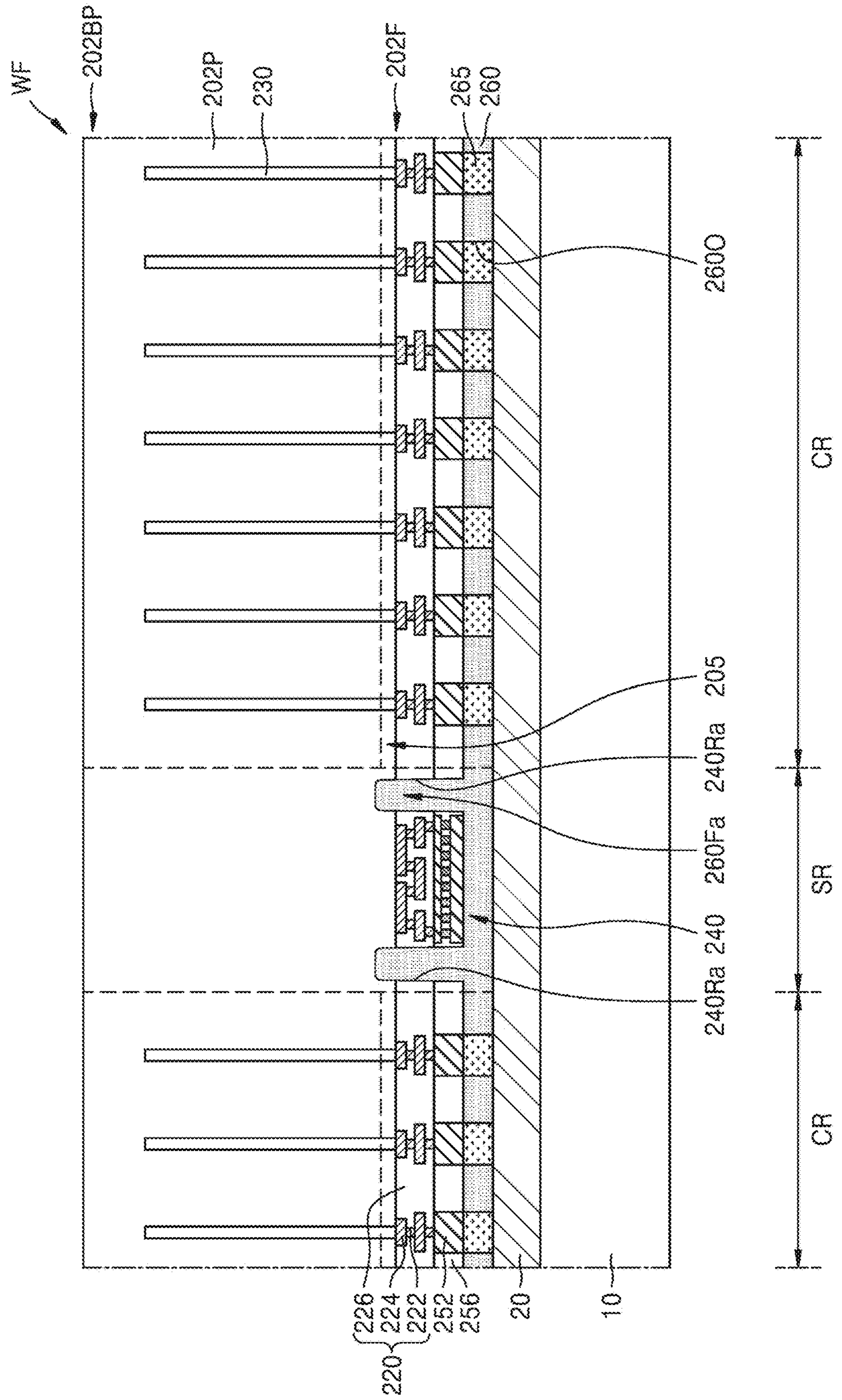

Referring to FIGS. 4F and 4G, a resultant structure of FIG. 4F is turned upside down and attached to a carrier substrate 10 to which a release film 20 is attached. In FIGS. 4A to 4F, the preliminary non-active surface 202BP faces downward, but in FIG. 4G, the preliminary non-active surface 202BP faces upward.

Figure 4H:
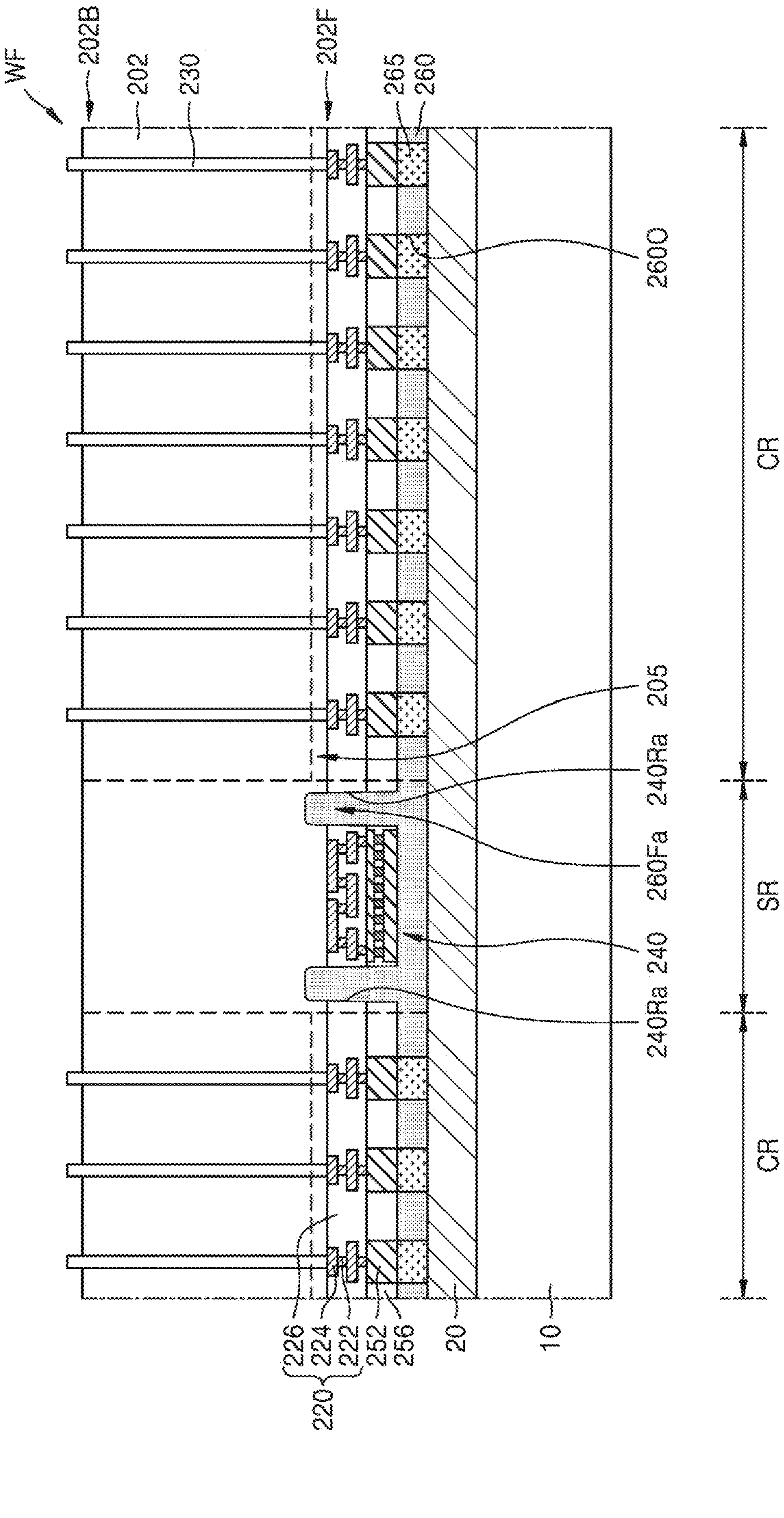

Referring to FIGS. 4G and 4H, an upper portion of the preliminary semiconductor substrate 202P is removed to expose the plurality of second through electrodes 230. For example, a second semiconductor substrate 202 having a second non-active surface 202B may be formed by removing an upper portion of the preliminary semiconductor substrate 202P from the preliminary non-active surface 202BP. Upper portions of the plurality of second penetration electrodes 230 may protrude upward from the second non-active surface 202B of the second semiconductor substrate 202.

Figure 4I:
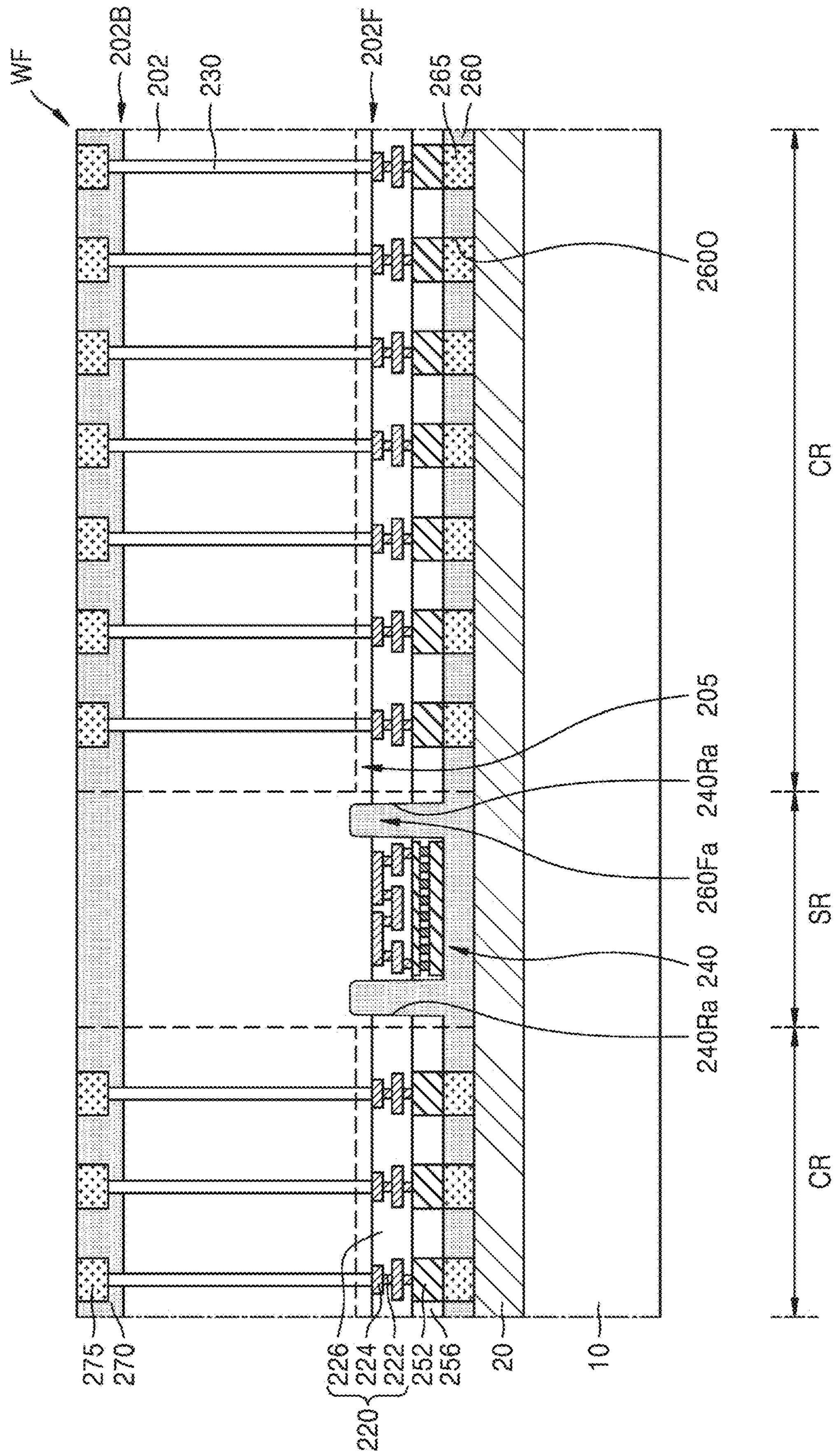

Referring to FIG. 4I, a plurality of second rear chip connection pads 275 and a second rear insulating layer 270 surrounding the plurality of second rear chip connection pads 275 are formed on the second non-active surface 202B of the second semiconductor substrate 202. The plurality of second rear chip connection pads 275 may be formed on the second non-active surface 202B of the second semiconductor substrate 202 to be connected to the plurality of second through electrodes 230.

Figure 4J:
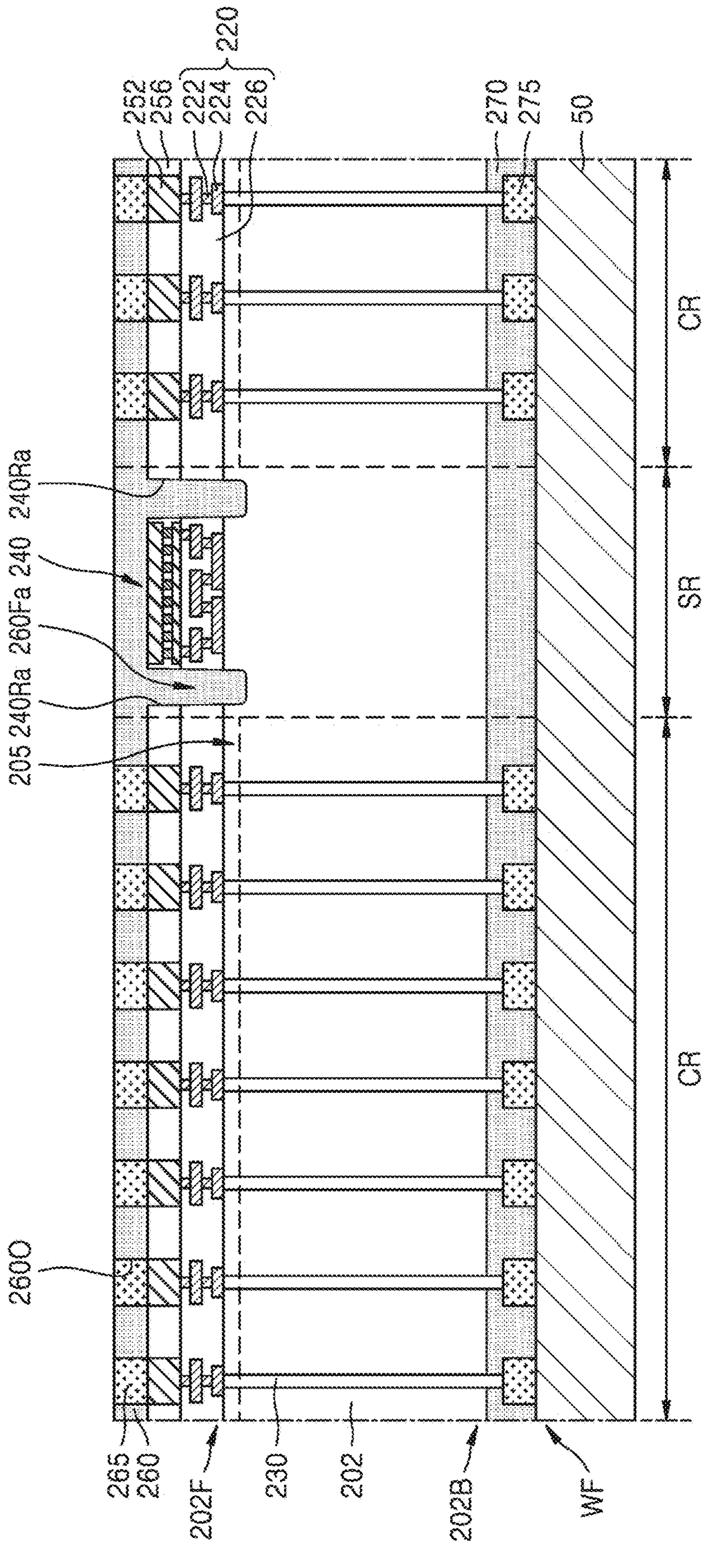

Referring to FIGS. 4I and 4J, after the wafer WF is separated from the carrier substrate 10 to which the release film 20 is attached, the wafer WF is turned upside down and attached to a dicing film 50. In FIGS. 4H to 4I, the second non-active surface 202B faces upward, but in FIG. 4J, the second non-active surface 202B faces downward.

Figure 4K:
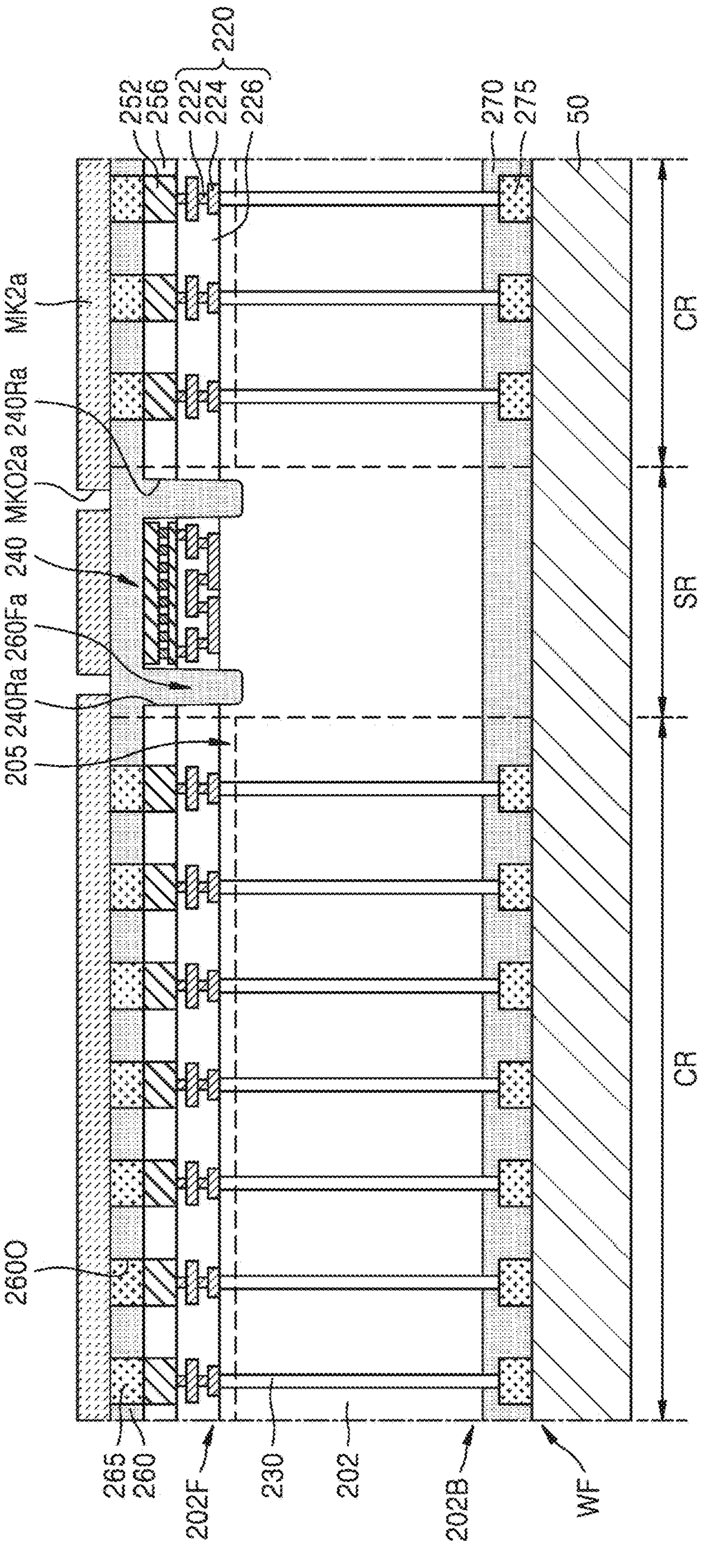

Referring to FIG. 4K, a second mask layer MK2*a* having a second mask opening MKO2*a* is formed on the plurality of second front chip connection pads 265 and the second front insulating layer 260. The plurality of second mask openings MKO2*a* may be positioned in the scribe lane region SR to overlap a portion of the filling insulating portion 260Fa in the vertical direction.

Figure 4L:
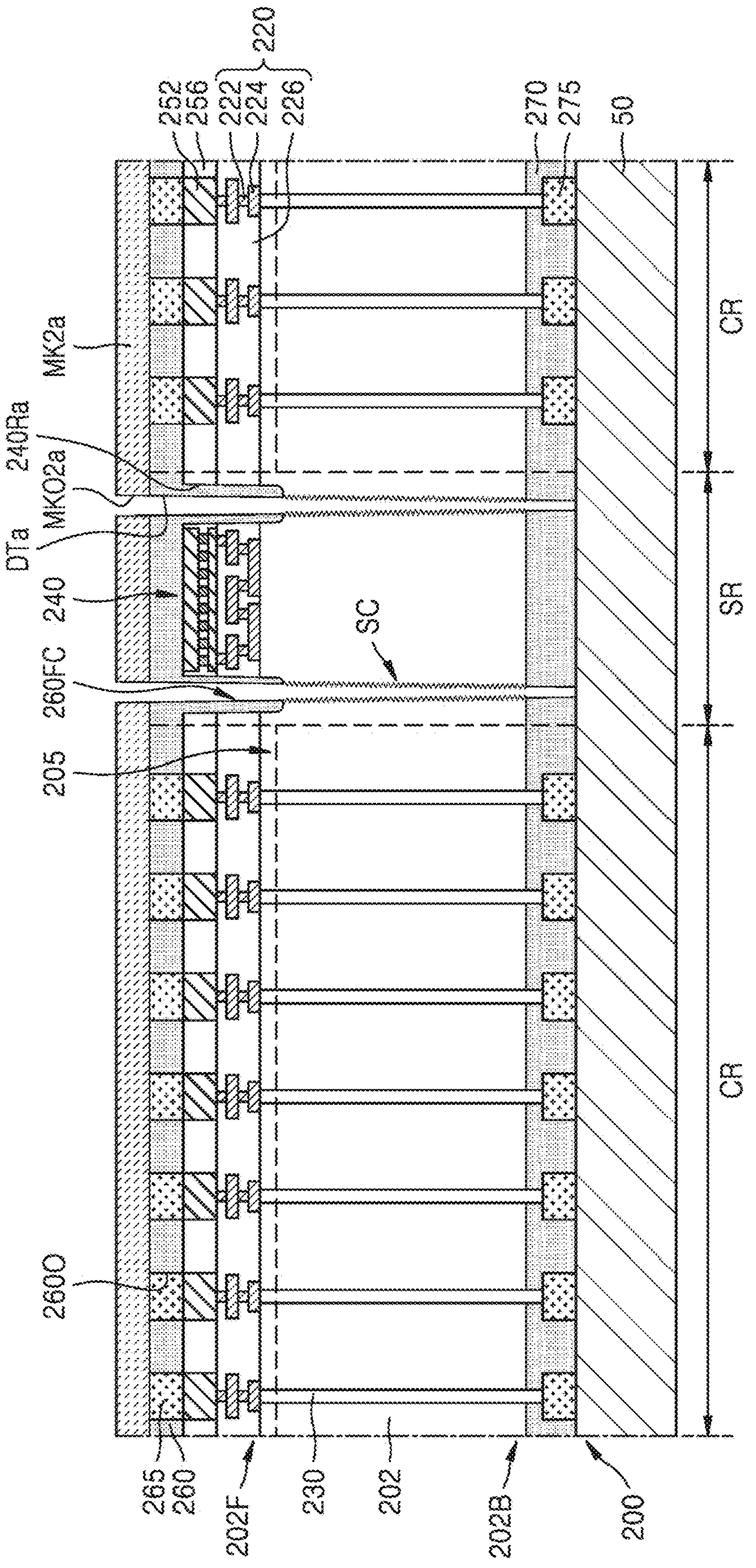

Referring to FIGS. 4K and 4L, a portion of the filling insulating portion 260Fa, a portion of the second semiconductor substrate 202, and a portion of the second rear insulating layer 270 are removed using the second mask layer MK2*a* having the second mask opening MKO2*a* as an etching mask to form a dicing trench DTa. The dicing trench DTa may be formed to be apart from the TEG 240 so that the TEG 240 is not exposed in the dicing trench DTa. The dicing trench DTa may pass through the wafer WF and divide the wafer WF into a plurality of second semiconductor chips 200. In other words, singulation of cutting the wafer WF may be performed by forming the dicing trench DTa. After the dicing trench DTa is formed, the second mask layer MK2*a* may be removed.

A portion of the filling insulating portion 260Fa may remain as the cover insulating portion 260FC without being removed in the process of forming the dicing trench DTa. The cover insulating portion 260FC may be formed to extend along the side surface of the second semiconductor chip 200. The cover insulation 260FC may pass through the second active surface 202F of the second semiconductor substrate 202 and extend into the second semiconductor substrate 202.

In some example embodiments, the dicing trench DTa may be formed by plasma etching. For example, the dicing trench DT may be formed by removing a portion of the filling insulating portion 260Fa, a portion of the second semiconductor substrate 202, and a portion of the second rear insulating layer 270 by performing plasma etching using the second mask layer MK2*a* having the second mask opening MKO2*a* as an etch mask. In some example embodiments, the dicing trench DTa may extend from the upper surface of the second front insulating layer 260, that is, the upper surface of the filling insulating portion 260F, to the lower surface of the second rear insulating layer 270, and may have a reduced horizontal width than the scribe lane region SR.

A side surface of the second front insulating layer 260 exposed in the dicing trench DTa, that is, a side surface of the cover insulating portion 260FC may have a substantially flat surface. A side surface of the second rear insulating layer 270 exposed in the dicing trench DTa may have a substantially flat surface. A side surface of the second semiconductor substrate 202 exposed in the dicing trench DTa may be a rough surface having a scallop SC.

Figure 4M:
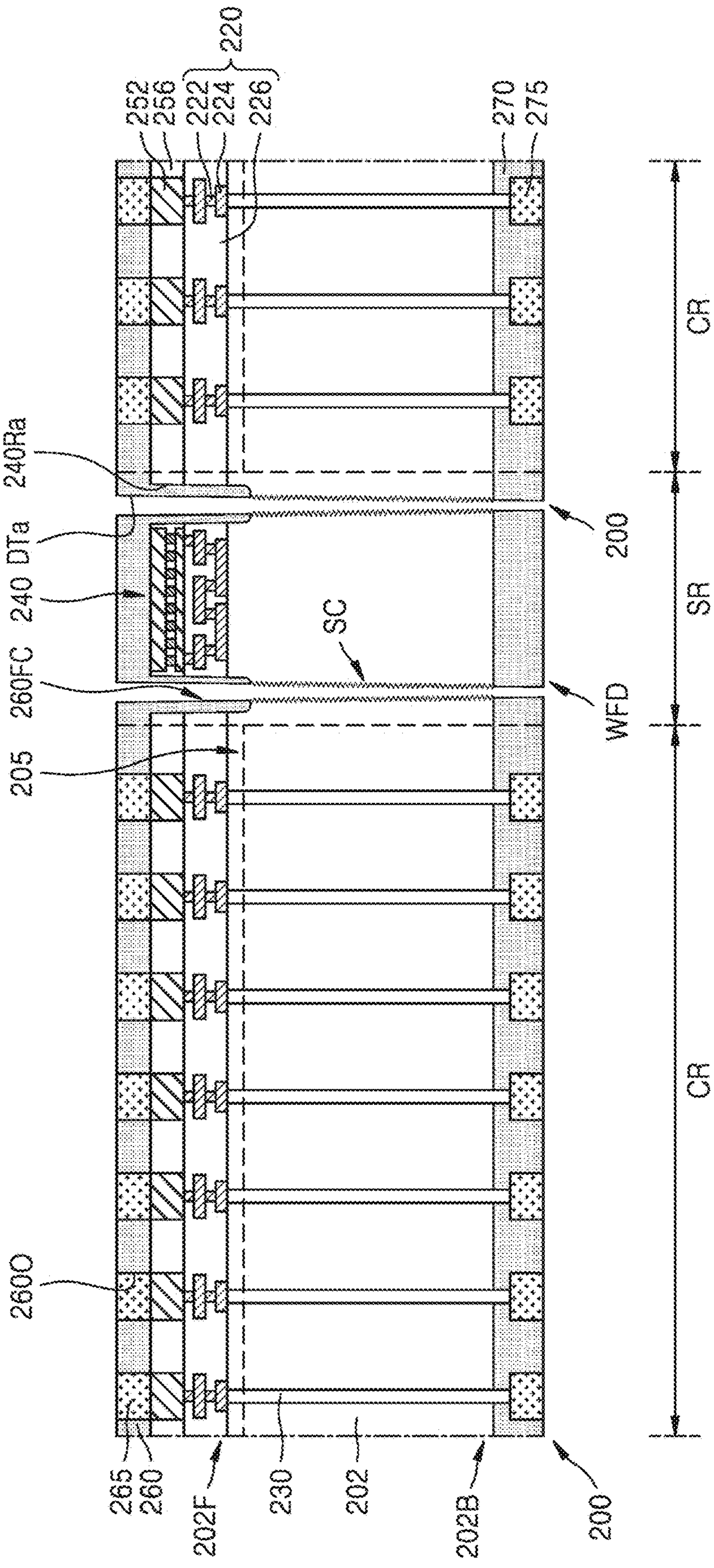

Referring to FIGS. 4L and 4M, the plurality of second semiconductor chips 200 are separated from the dicing film 50. A dummy wafer portion WFD, which is positioned between the plurality of second semiconductor chips 200 based on the dicing trench DTa and includes a TEG 240, may be separated from the plurality of second semiconductor chips 200 and removed.

In some example embodiments, structures that are similar to the second front insulating layer 260 including the cover insulating portion 260FC and the plurality of second front chip connection pads 265, described with reference to FIGS. 4A to 4M, may also be formed in the first semiconductor chip 100.

Figure 5A:
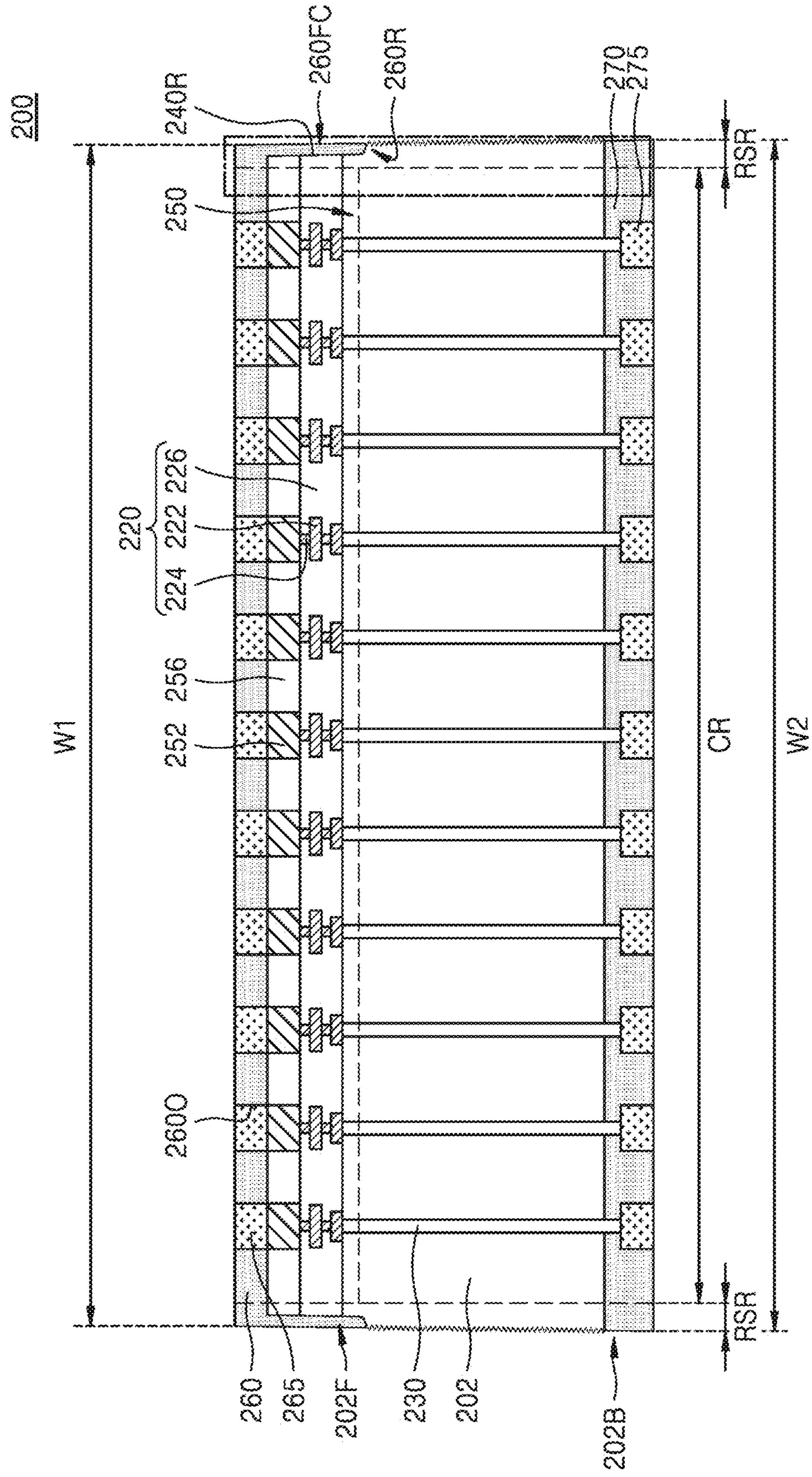
FIGS. 5A and 5B are cross-sectional and enlarged cross-sectional views of a semiconductor chip according to an example embodiment.
Figure 5B:
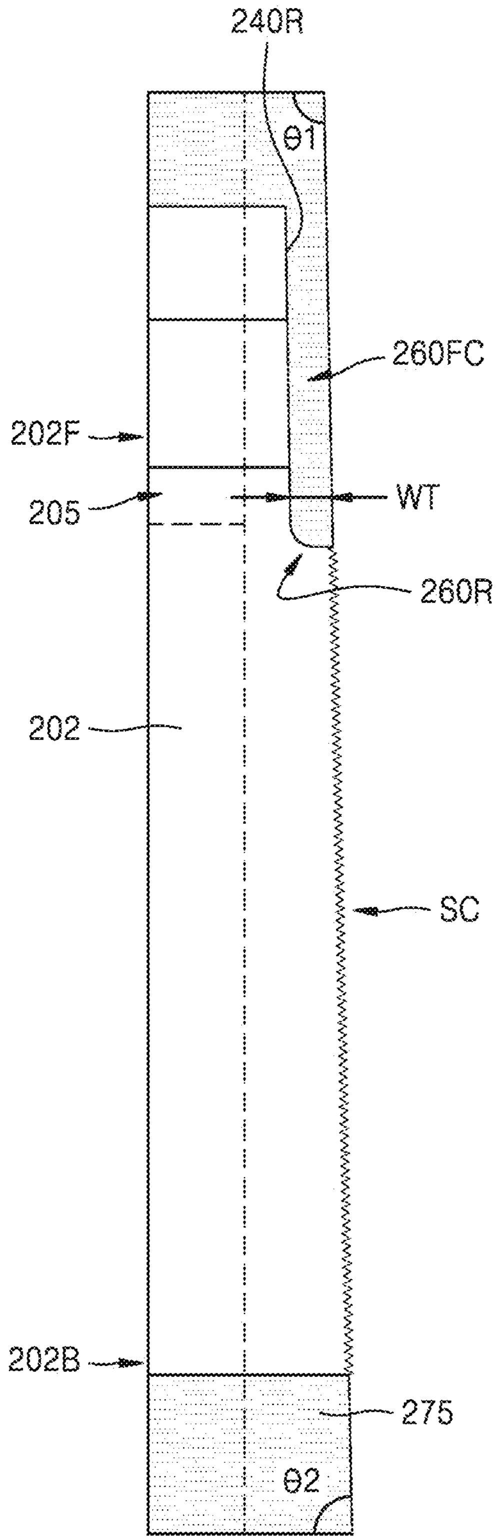

FIGS. 5A and 5B are cross-sectional and enlarged cross-sectional views of a semiconductor chip according to an example embodiment. FIGS. 5A to 5B illustrate the second semiconductor chip 200 shown in FIG. 1, but the first semiconductor chip 100 may also be similar thereto.

Referring to FIGS. 5A and 5B, the second semiconductor chip 200 may include a chip region CR and a residual scribe lane region RSR surrounding the chip region CR. The second semiconductor chip 200 may include a second semiconductor substrate 202 having a second active surface 202F and a second non-active surface 202BP opposite to each other, a second semiconductor device 205 disposed on the second active surface 202F of the second semiconductor substrate 202, a plurality of second through electrodes 230 passing through at least a portion of the second semiconductor substrate 202, and a wiring layer 220 disposed on the second active surface 202F. The second semiconductor chip 200 shown in FIG. 5A is upside down from the second semiconductor chip 200 shown in FIG. 1. In other words, in the second semiconductor chip 200 shown in FIG. 1, the second non-active surface 202B is located on the upper side and the second active surface 202F is located on the lower side, but in the second semiconductor chip 200 shown in FIG. 5A, the second active surface 202F is located on the upper side and the second non-active surface 202B is located on the lower side.

The wiring layer 220 may include a plurality of wiring patterns 222, a plurality of wiring vias 224 connected to the plurality of wiring patterns 222, and a lower inter-wire insulating layer 226 surrounding the plurality of wiring patterns 222 and the plurality of wiring vias 224. A plurality of second wiring structures 295 and an inter-wire insulating layer 290 surrounding the plurality of second wiring structures 295 may be disposed on the wiring layer 220. The plurality of second through electrodes 230 may be electrically connected to the plurality of second wiring structures 295 through the plurality of wiring patterns 222 and the plurality of wiring vias 224.

A plurality of second front chip connection pads 265 may be disposed on the plurality of second wiring structures 295 (which includes the plurality of wiring connection structures 252 and the plurality of wiring layers 220), and a second front insulating layer 260 may be disposed on the inter-wire insulating layer 290 (which includes the upper inter-wire insulating layer 256 and the lower inter-wire insulating layer 226) to surround the plurality of second front chip connection pads 265. The second front insulating layer 260 has a plurality of through openings 2600, through which the plurality of wiring connection structures 252 are provided, and then in which the plurality of second front chip connection pads 265 is provided. The second front insulating layer 260 may further include a cover insulating portion 260FC extending along the side surface of the second semiconductor chip 200. The cover insulating portion 260FC may cover the side surface of the inter-wire insulating layer 290 including the upper inter-wire insulating layer 256 and the lower inter-wire insulating layer 226, and may pass through the second active surface 202F of the second semiconductor substrate 202 and extend into the second semiconductor substrate 202. The cover insulating portion 260FC may fill a removal recess 240R. The removal recess 240R may have a shape in which a corner portion of the bottom surface thereof is round, and the cover insulating portion 260FC may have a round portion 260R having a round lower corner portion. The round portion 260R of the cover insulating portion 260FC may contact the second semiconductor substrate 202.

A plurality of second rear chip connection pads 275 connected to the plurality of second through electrodes 230, and a second rear insulating layer 270 surrounding the plurality of second rear chip connection pads 275 may be disposed on the second non-active surface 202B of the second semiconductor substrate 202.

The upper surface and the lower surface of the second semiconductor chip 200, that is, the front surface and the rear surface thereof may have different horizontal widths and different horizontal areas. In some example embodiments, the upper surface of the second semiconductor chip 200 may have a first horizontal width W1, and the lower surface of the second semiconductor chip 200 may have a second horizontal width W2 greater than the first horizontal width W1. The first horizontal width W1 may be the horizontal width of the upper surface of the second front insulating layer 260, and the second horizontal width W2 may be the horizontal width of the lower surface of the second rear insulating layer 270. The upper surface of the second semiconductor chip 200 may have a smaller horizontal area than the lower surface of the second semiconductor chip 200. For example, a vertical cross-section of the second semiconductor chip 200 may have a trapezoidal shape, and a lower side of a pair of parallel sides of the trapezoidal shape may be greater than an upper side of the pair of parallel opposite sides.

A side surface of the second semiconductor chip 200 may have a first angle θ1 with respect to the upper surface of the second semiconductor chip 200, that is, the upper surface of the second front insulating layer 260, and may have a second angle θ2 with respect to the lower surface of the second semiconductor chip 200, that is, the lower surface of the second rear insulating layer 270. The first angle θ1 may have a greater value than that of the second angle θ2. The first angle θ1 may have a value greater than 90°, and the second angle θ2 may have a value less than 90°. For example, the first angle θ1 may have a value greater than 90° and less than 101°, and the second angle θ2 may have a value less than 90° and greater than 88°.

Only the cover insulating portion 260FC of the second front insulating layer 260, the second semiconductor substrate 202, and the second rear insulating layer 270 may be exposed on the side surface of the second semiconductor chip 200. On the side surface of the second semiconductor chip 200, only the cover insulating portion 260FC that is a portion of the second front insulating layer 260 may be disposed between the upper surface of the second semiconductor chip 200, that is, the front surface thereof, and the second semiconductor substrate 202.

Of the side surface of the second semiconductor chip 200, the side surface of the second front insulating layer 260, that is, the side surface of the cover insulating portion 260FC may have a substantially flat surface and the side surface of the second rear insulating layer 270 may have a substantially flat surface. Of the side surface of the second semiconductor chip 200, the side surface of the second semiconductor substrate 202 may be a rough surface having a scallop SC.

Figure 6:
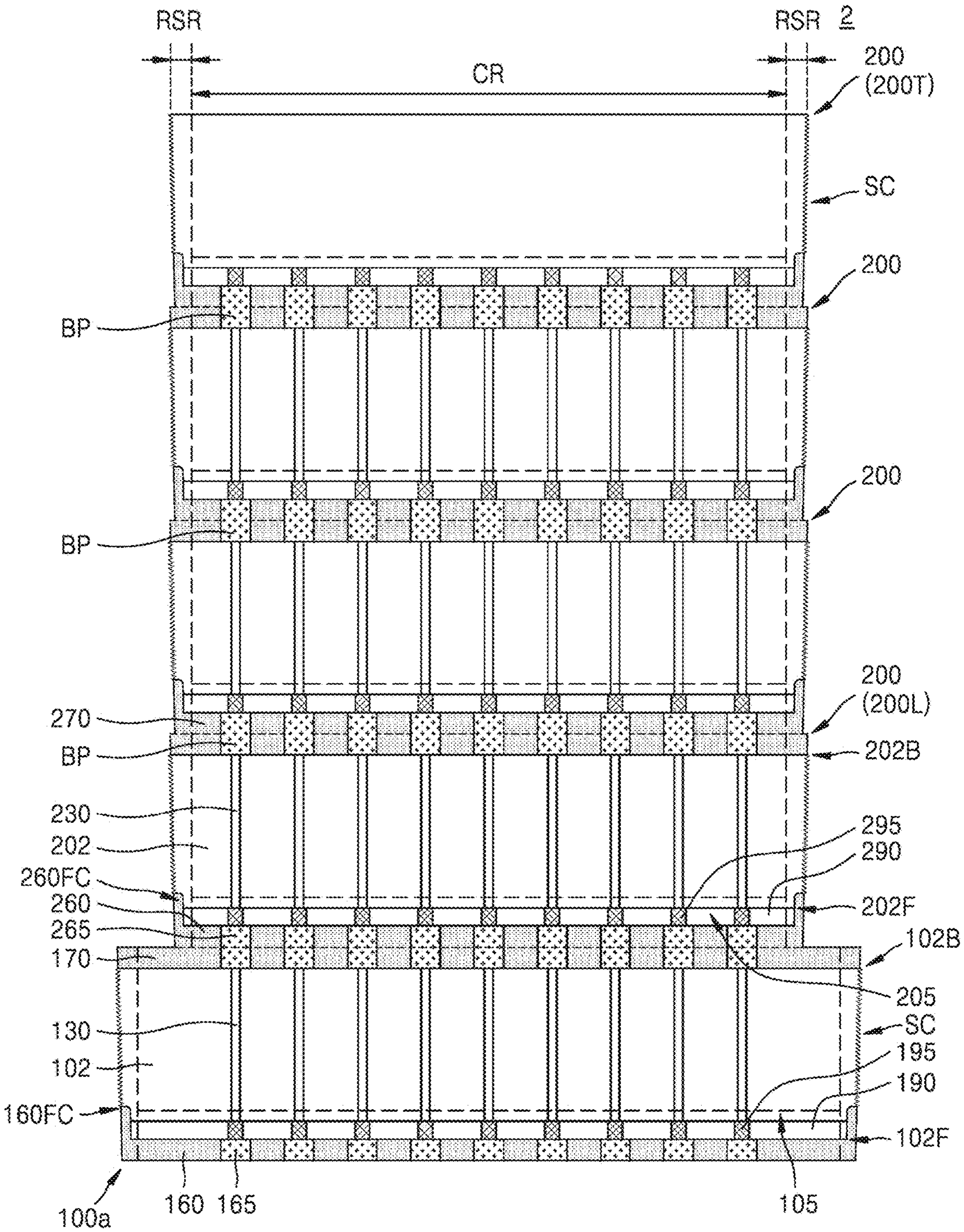
FIG. 6 is a cross-sectional view of a semiconductor package according to an example embodiment.

FIG. 6 is a cross-sectional view of a semiconductor package 2 according to an example embodiment. In FIG. 6, the same reference numerals as those in FIG. 1 denote the same members as those in FIG. 1, and repeated descriptions thereof may be omitted.

Referring to FIG. 6, the semiconductor package 2 includes a first semiconductor chip 100*a* and a plurality of second semiconductor chips 200.

In the semiconductor package 1*a*, the first semiconductor chip 100*a* and the plurality of second semiconductor chips 200 may be electrically connected to each other through a plurality of bonding pads BP to exchange signals and to provide a power voltage and a ground voltage. For example, the plurality of bonding pads BP may be arranged between the lowermost second semiconductor chip 200L and the first semiconductor chip 100*a*, and between two second semiconductor chips 200 adjacent to each other from among the plurality of second semiconductor chips 200.

The first semiconductor chip 100*a* may include a first semiconductor substrate 102 having a first active surface 102F and a first non-active surface 102B opposite to each other, a first semiconductor device 105 disposed on the first active surface 102F of the first semiconductor substrate 102, and a plurality of first through electrodes 130 passing through at least a portion of the first semiconductor substrate 102.

A plurality of first wiring structures 195 electrically connected to the plurality of first through electrodes 130 and a first inter-wire insulating layer 190 surrounding the plurality of first wiring structures 195 may be disposed on the first active surface 102F of the first semiconductor substrate 102. A first rear insulating layer 170 may be disposed on the first non-active surface 102B of the first semiconductor substrate 102. A plurality of first front chip connection pads 165 and a first front insulating layer 160 may be disposed on the plurality of first wiring structures 195 and the first inter-wire insulating layer 190. The plurality of first front chip connection pads 165 may be disposed on the plurality of first wiring structures 195 and electrically connected to the plurality of first wiring structures 195. The first front insulating layer 160 may surround the plurality of first front chip connection pads 165. The first front insulating layer 160 may further include a first cover insulating portion 160FC extending along the side surface of the first semiconductor chip 100*a*. The first cover insulating portion 160FC may pass through the first active surface 102F of the first semiconductor substrate 102 and extend into the first semiconductor substrate 102.

In some example embodiments, the semiconductor package 2 may be attached on an interposer including a plurality of package connection pads, and the plurality of package connection pads of the interposer and the plurality of first front chip connection pads 165 of the first semiconductor chip 100*a* may be diffusion-bonded to form a single body through diffusion of metal atoms included therein, thereby forming a plurality of bonding pads similar to the plurality of bonding pads BP.

The first rear insulating layer 170 may surround portions of bonding pads BP, which are disposed between the lowermost second semiconductor chip 200L among the plurality of second semiconductor chips 200 and the first semiconductor chip 100*a*, from among the plurality of bonding pads BP. For example, the first rear insulating layer 170 may surround lower portions of bonding pads BP, which are disposed between the lowermost second semiconductor chip 200L among the plurality of second semiconductor chips 200 and the first semiconductor chip 100*a*, from among the plurality of bonding pads BP.

The first semiconductor chip 100*a* may be formed in substantially the same manner as the method of manufacturing the second semiconductor chip 200, described with reference to FIGS. 3A to 4M. In addition, the shape of the first semiconductor chip 100*a* is substantially the same as that of the second semiconductor chip 200 shown in FIGS. 5A and 5B, but the horizontal width and horizontal area of the first semiconductor chip 100*a* may respectively have greater values than the horizontal width and horizontal area of each of the plurality of second semiconductor chips 200.

The second semiconductor chip 200 may include a second semiconductor substrate 202 having a second active surface 202F and a second non-active surface 202BP opposite to each other, a second semiconductor device 205 disposed on the second active surface 202F of the second semiconductor substrate 202, and a plurality of second through electrodes 230 passing through at least a portion of the second semiconductor substrate 202. A plurality of second wiring structures 295 electrically connected to the plurality of second through electrodes 230 and an inter-wire insulating layer 290 surrounding the plurality of second wiring structures 295 may be disposed on the second active surface 202F of the second semiconductor substrate 202. A second front insulating layer 260 may be disposed on the second inter-wire insulating layer 290. The second front insulating layer 260 may surround portions of the plurality of bonding pads BP. For example, the second front insulating layer 260 may surround upper portions of the plurality of bonding pads BP.

The second front insulating layer 260 may further include a second cover insulating portion 260FC extending along a side surface of the second semiconductor chip 200. The second cover insulating portion 260FC may pass through the second active surface 202F of the second semiconductor substrate 202 and extend into the second semiconductor substrate 202.

A second rear insulating layer 270 may be disposed on the second non-active surface 202B of the second semiconductor substrate 202. The second rear insulating layer 270 may surround portions of the plurality of bonding pads BP. For example, the second rear insulating layer 270 may surround lower portions of bonding pads BP disposed between two adjacent second semiconductor chips 200, respectively, from among a plurality of bonding pads BP.

On the side surface of the first semiconductor chip 100*a*, only the first cover insulating portion 160FC may be disposed between the lower surface of the first semiconductor chip 100*a*, that is, the front surface thereof, and the first semiconductor substrate 102. The first cover insulating portion 160FC is a portion of the first front insulating layer 160 and may include a single material. In other words, on the side surface of the first semiconductor chip 100*a*, only an insulating layer including a single material may be disposed between the lower surface of the first semiconductor chip 100*a*, that is, the front surface thereof, and the first semiconductor substrate 102.

Only the first cover insulating portion 160FC of the first front insulating layer 160, the first rear insulating layer 170, and the first semiconductor substrate 102 may be exposed on the side surface of the first semiconductor chip 100*a* and collectively constitute the side surface of the first semiconductor chip 100*a*. Of the side surface of the first semiconductor chip 100*a*, the side surface of the first front insulating layer 160, that is, the side surface of the first cover insulating portion 160FC may have a substantially flat surface, and the side surface of the first rear insulating layer 170 may have a substantially flat surface. Of the side surface of the first semiconductor chip 100*a*, the side surface of the first semiconductor substrate 102 may be a rough surface having a scallop SC.

On the side surface of each of the plurality of second semiconductor chips 200, only the second cover insulating portion 260FC may be disposed between the lower surface of the second semiconductor chip 200, that is, the front surface thereof, and the second semiconductor substrate 202. The second cover insulating portion 260FC is a portion of the second front insulating layer 260 and may include a single material. In other words, on the side surface of each of the plurality of second semiconductor chips 200, only an insulating layer including a single material may be disposed between the lower surface of the second semiconductor chip 200, that is, the front surface of the second semiconductor chip 200, and the second semiconductor substrate 202.

The second cover insulating portion 260FC of the second front insulating layer 260, the second rear insulating layer 270, and the second semiconductor substrate 202 may be exposed on the side surface of each of the plurality of the second semiconductor chips 200. Of the side surface of the second semiconductor chip 200, the side surface of the second front insulating layer 260, that is, the side surface of the second cover insulating portion 260FC may have a substantially flat surface and the side surface of the second rear insulating layer 270 may have a substantially flat surface. Of the side surface of the second semiconductor chip 200, the side surface of the second semiconductor substrate 202 may be a rough surface having a scallop SC.

In the semiconductor package 2, the first semiconductor chip 100*a* may be disposed such that the first active surface 102F of the first semiconductor substrate 102 faces downward and the first non-active surface 102B thereof faces upward, and the second semiconductor chip 200 may be disposed such that the second active surface 202F of the second semiconductor substrate 202 faces downward and the second non-active surface 202B thereof faces upward. The plurality of second semiconductor chips 200 may be sequentially stacked on the first semiconductor chip 100*a* such that the second active surface 202F faces the first non-active surface 102B of the first semiconductor chip 100*a*.

The horizontal width and horizontal area of the first semiconductor chip 100*a* may have values greater than those of each of the plurality of second semiconductor chips 200. The upper surface and the lower surface of the first semiconductor chip 100*a*, that is, the rear surface and the front surface thereof may have different horizontal widths and different horizontal areas. In some example embodiments, the upper surface of the first semiconductor chip 100*a* may have a larger horizontal width and larger horizontal area than the lower surface of the first semiconductor chip 100*a*. For example, a vertical cross-section of the first semiconductor chip 100*a* may have a trapezoidal shape, and an upper side of a pair of parallel sides of the trapezoidal shape may be greater than a lower side of the pair of parallel opposite sides. The upper surface and the lower surface of the second semiconductor chip 200, that is, the rear surface and the front surface thereof may have different horizontal widths and different horizontal areas. In some example embodiments, the upper surface of the second semiconductor chip 200 may have a larger horizontal width and larger horizontal area than the lower surface of the second semiconductor chip 200. For example, a vertical cross-section of the second semiconductor chip 200 may have a trapezoidal shape, and an upper side of a pair of parallel sides of the trapezoidal shape may be greater than a lower side of the pair of parallel opposite sides.

Each of the first semiconductor chip 100*a* and the second semiconductor chip 200 may include a chip region CR and a residual scribe lane region RSR surrounding the chip region CR. The first cover insulating portion 160FC may be arranged in the residual scribe lane region RSR of the first semiconductor chip 100, and the second cover insulating portion 260FC may be arranged in the residual scribe lane region RSR of the second semiconductor chip 200.

While the inventive concepts have been particularly shown and described with reference to some example embodiments thereof, it will be understood that various changes in form and details may be made therein without departing from the spirit and scope of the following claims.

What is claimed is:

1. A semiconductor chip comprising:

a semiconductor substrate having an active surface and a non-active surface opposite to each other;

a plurality of through electrodes passing through the semiconductor substrate;

a plurality of wiring structures on the active surface and electrically connected to the plurality of through electrodes;

an inter-wire insulating layer surrounding the plurality of wiring structures;

a plurality of front chip connection pads electrically connected to the plurality of wiring structures;

a front insulating layer surrounding the plurality of front chip connection pads, on the inter-wire insulating layer;

a plurality of rear chip connection pads on the non-active surface and electrically connected to the plurality of through electrodes; and a rear insulating layer surrounding the plurality of rear chip connection pads, on the non-active surface, wherein the front insulating layer includes a cover insulating portion covering a side surface of the inter-wire insulating layer and extending into the semiconductor substrate through the active surface.

2. The semiconductor chip of claim 1, wherein only the cover insulating portion, the semiconductor substrate, and the rear insulating layer are exposed at a side surface of the semiconductor chip.

3. The semiconductor chip of claim 2, wherein, of the side surface of the semiconductor chip, a side surface of the semiconductor substrate is a surface having a scallop.

4. The semiconductor chip of claim 3, wherein, of the side surface of the semiconductor chip, a side surface of the cover insulating portion and a side surface of the rear insulating layer are flat surfaces.

5. The semiconductor chip of claim 1, wherein the side surface of the semiconductor chip has a first angle with respect to an upper surface of the front insulating layer and a second angle with respect to a lower surface of the rear insulating layer, the second angle being less than the first angle.

6. A semiconductor package comprising:

a first semiconductor chip including a first semiconductor substrate having a first active surface and a first non-active surface opposite to each other, a plurality of first through electrodes passing through the first semiconductor substrate, a first front insulating layer on the first active surface, and a first rear insulating layer on the first non-active surface;

a second semiconductor chip including a second semiconductor substrate having a second active surface and a second non-active surface opposite to each other, and a second front insulating layer on the second active surface, the second active surface facing the first non-active surface and the second semiconductor chip being stacked on the first semiconductor chip; and a plurality of first bonding pads between the first semiconductor chip and the second semiconductor chip, surrounded by the first rear insulating layer and the second front insulating layer, and electrically connected to the plurality of first through electrodes, wherein the second front insulating layer includes a cover insulating portion extending into the second semiconductor substrate through the second active surface and covering a side surface of the second semiconductor chip.

7. The semiconductor package of claim 6, wherein, on the side surface of the second semiconductor chip, the cover insulating portion includes a single material, and only the cover insulating portion is between a front surface of the second semiconductor chip, which is on a side of the second active surface, and the second semiconductor substrate.

8. The semiconductor package of claim 6, wherein the cover insulating portion has a round shape at a corner portion thereof, the corner portion being in contact with the second semiconductor substrate.

9. The semiconductor package of claim 6, wherein the first semiconductor chip has a vertical cross-section having a rectangular shape, and the second semiconductor chip has a vertical cross-section having a trapezoidal shape.

10. The semiconductor package of claim 6, wherein, of the side surface of the second semiconductor chip, a first portion of the side surface of the second semiconductor substrate has a surface having scallops, and a second portion of the side surface of the second semiconductor substrate has a flat surface.

11. The semiconductor package of claim 10, wherein a side surface of the first semiconductor chip is a flat surface in its entirety.

12. The semiconductor package of claim 10, wherein a lower surface of the second semiconductor chip facing the first semiconductor chip has a smaller horizontal width than an upper surface of the second semiconductor chip.

13. The semiconductor package of claim 6, wherein the second semiconductor chip further includes:

a plurality of wiring structures between the second active surface and the second front insulating layer and electrically connected to the plurality of first bonding pads; and an inter-wire insulating layer surrounding the plurality of wiring structures, wherein the cover insulating portion covers a side surface of the inter-wire insulating layer.

14. The semiconductor package of claim 13, wherein the second semiconductor chip further includes:

a plurality of second through electrodes passing through the second semiconductor substrate and electrically connected to the plurality of wiring structures; and a second rear insulating layer on the second non-active surface, wherein only the cover insulating portion, the second semiconductor substrate, and the second rear insulating layer are exposed at the side surface of the second semiconductor chip.

15. The semiconductor package of claim 14, wherein the first rear insulating layer and the second front insulating layer surround the plurality of first bonding pads and are coupled to each other, and the second semiconductor chip includes a first-second semiconductor chip and a second-second semiconductor chip stacked on the first-second semiconductor chip, the second rear insulating layer of the first-second semiconductor chip and the second front insulating layer of the second-second semiconductor chip are coupled to each other and surround a plurality of second bonding pads between the first-second semiconductor chip and the second-second semiconductor chip.

16. The semiconductor package of claim 14, wherein each of the plurality of first bonding pads is a single body including a lower portion and an upper portion that are diffusion-bonded to each other.

17. A semiconductor package comprising:

a high bandwidth memory (HBM) control die including a first semiconductor substrate having a first active surface and a first non-active surface opposite to each other, a plurality of first through electrodes passing through the first semiconductor substrate, a first front insulating layer on the first active surface, and a first rear insulating layer on the first non-active surface;

a plurality of dynamic random access memory (DRAM) dies including a second semiconductor substrate having a second active surface and a second non-active surface opposite to each other, a plurality of second through electrodes passing through the second semiconductor substrate, a second front insulating layer on the second active surface, and a second rear insulating layer on the second non-active surface, the second active surface facing the first non-active surface, and the plurality of DRAM dies being sequentially stacked on the HBM control die and having horizontal widths less than a horizontal width of the HBM control die;

a plurality of first bonding pads between a lowermost DRAM die of the plurality of DRAM dies and the HBM control die and surrounded by the second front insulating layer of the lowermost DRAM die of the plurality of DRAM dies and the first rear insulating layer; and a plurality of second bonding pads between two adjacent DRAM dies among the plurality of DRAM dies, and surrounded by the second front insulating layer and the second rear insulating layer between the two adjacent DRAM dies among the plurality of DRAM dies, wherein the second front insulating layer includes a cover insulating portion extending into the second semiconductor substrate through the second active surface and covering a side surface of each of the plurality of DRAM dies, and only the cover insulating portion, the second semiconductor substrate, and the second rear insulating layer are exposed at the side surface of each of the plurality of DRAM dies.

18. The semiconductor package of claim 17, wherein, of the side surface of each of the plurality of DRAM dies, a side surface of the second semiconductor substrate is a surface having scallops, and a side surface of the cover insulating portion and a side surface of the second rear insulating layer are flat surfaces.

19. The semiconductor package of claim 17, wherein each of the plurality of first bonding pads and each of the plurality of second bonding pads include Cu, and each of the first rear insulating layer, the second front insulating layer, and the second rear insulating layer includes silicon oxide.

20. The semiconductor package of claim 17, wherein each of the plurality of DRAM dies facing the HBM control die has a lower surface having a first horizontal width and an upper surface having a second horizontal width, the first horizontal width being smaller than the second horizontal width, and the side surface of each of the plurality of DRAM dies has a first angle with respect to a lower surface of the second front insulating layer and a second angle with respect to an upper surface of the second rear insulating layer, the second angle being less than the first angle.

* * * * *